(12) United States Patent
Otsuka et al.

(10) Patent No.: US 7,327,554 B2
(45) Date of Patent: Feb. 5, 2008

(54) ASSEMBLY OF SEMICONDUCTOR DEVICE, INTERPOSER AND SUBSTRATE

(75) Inventors: Jun Otsuka, Aichi (JP); Manabu Sato, Nagoya (JP); Junichi Ito, Mie (JP); Kazuhiro Hayashi, Aichi (JP); Motohiko Sato, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 387 days.

(21) Appl. No.: 10/801,867

(22) Filed: Mar. 17, 2004

(65) Prior Publication Data

US 2004/0184219 A1 Sep. 23, 2004

(30) Foreign Application Priority Data

| Mar. 19, 2003 | (JP) | ............................. 2003-076536 |
| Jul. 18, 2003 | (JP) | ............................. 2003-199234 |
| Dec. 26, 2003 | (JP) | ............................. 2003-432369 |

(51) Int. Cl.
*H01G 4/228* (2006.01)

(52) U.S. Cl. ................... 361/306.3; 361/311; 361/313; 361/321.1; 361/321.2; 361/306.1

(58) Field of Classification Search ............. 361/306.3, 361/306.2, 301.4, 302–305, 306.1, 321.1, 361/311–313; 174/75 R, 52.1, 260; 257/698, 257/700

See application file for complete search history.

(56) References Cited

U.S. PATENT DOCUMENTS

| 5,939,782 | A | * | 8/1999 | Malladi ...................... 257/698 |
| 6,034,864 | A | | 3/2000 | Naito et al. |
| 6,072,690 | A | * | 6/2000 | Farooq et al. ............ 361/321.2 |
| 6,183,669 | B1 | * | 2/2001 | Kubota et al. ........... 156/89.16 |
| 6,282,079 | B1 | * | 8/2001 | Nagakari et al. ........... 361/303 |
| 6,351,369 | B1 | * | 2/2002 | Kuroda et al. ........... 361/306.3 |
| 6,370,011 | B1 | | 4/2002 | Naito et al. |
| 6,391,422 | B1 | * | 5/2002 | Mori et al. ................. 428/131 |
| 6,462,932 | B1 | | 10/2002 | Naito et al. |
| 6,496,354 | B2 | | 12/2002 | Naito et al. |
| 6,532,143 | B2 | * | 3/2003 | Figueroa et al. ......... 361/301.4 |
| 6,549,395 | B1 | | 4/2003 | Naito et al. |
| 6,577,490 | B2 | * | 6/2003 | Ogawa et al. ........... 361/306.1 |
| 6,606,237 | B1 | * | 8/2003 | Naito et al. ............. 361/306.3 |
| 6,970,362 | B1 | * | 11/2005 | Chakravorty ............... 361/782 |
| 2002/0109958 | A1 | | 8/2002 | Naito et al. |

FOREIGN PATENT DOCUMENTS

| EP | 1-041-631 | A2 | 10/2000 |
| JP | 11-204372 | | 7/1999 |
| JP | 2000-208661 | A | 7/2000 |
| JP | 2000-349225 | A | 12/2000 |

\* cited by examiner

*Primary Examiner*—Nguyen T. Ha
(74) *Attorney, Agent, or Firm*—Sughrue Mion, Pllc.

(57) ABSTRACT

An assembly includes a semiconductor device having surface-connecting terminals, a substrate having surface-connecting pads, and a capacitor having an approximately plate-shaped capacitor main body having a first surface on which the semiconductor device is mounted and a second surface at which the capacitor main body is mounted on the substrate and a plurality of electrically conductive vias penetrating the capacitor main body between the first and second surfaces and connected to the surface-connecting terminals and the surface-connecting pads.

8 Claims, 16 Drawing Sheets

ASSEMBLY OF SEMICONDUCTOR DEVICE, INTERPOSER AND SUBSTRATE

BACKGROUND OF THE INVENTION

The present invention relates to improvements in or relating to an assembly of a semiconductor device, an interposer and a substrate. The present invention further relates to a capacitor, a semiconductor device equipped capacitor assembly, a capacitor equipped substrate assembly, an interposer, a semiconductor device equipped interposer assembly and an interposer equipped substrate assembly suited for use in the assembly of a semiconductor device, an interposer and a substrate. The present invention further relates to an interposer of the type to be interposed between a semiconductor device and a package in which the semiconductor device is encased or mounted and having a wiring for electrically connecting the semiconductor device and the package with each other. The present invention further relates to a method of producing an interposer of the above-described type.

Recently, various assemblies or packages in which a so-called interposer is disposed between an IC chip and a circuit board in place of directly connecting the IC chip with the circuit board. In the meantime, by the advancement of the integrated circuit technology, the operation speed of the IC chip is becoming higher. This amplifies the noise at the power circuit or the like and possibly causes an erroneous operation. Thus, in the above-described assembly, an attempt has been made to remove the noise and thereby attain a desirable supply of power to the IC chip. For example, it has already been proposed to embed a capacitor in the circuit board side and connect the capacitor to the IC chip by interposing therebetween conductors of the interposer as disclosed in Japanese Unexamined Patent Publication No. 2000-349225.

Further, with respect to a method of connecting a mounting substrate of an IC package or the like and a printed circuit board such as a motherboard, there has been proposed to connect the mounting substrate and the printed circuit board by interposing therebetween an interposer as disclosed in Unexamined Japanese Patent Publication No. 2000-208661.

SUMMARY OF THE INVENTION

Generally, in case a wiring (capacitor connecting wiring) connecting between a capacitor and an IC chip is provided, the possibility that noise is superposed on the capacitor connecting wiring increases with increase in the length of the capacitor connecting wiring. Accordingly, in order to enhance the ability of removing noise, it is desirable to make the capacitor connecting wiring as shorter as possible.

In the meantime, in the above-described assembly in which the capacitor is embedded in the circuit board side, the length of the wiring (capacitor connecting wiring) becomes naturally longer than that corresponding to the thickness of the interposer. Accordingly, in order to attain further reduction of noise and thereby improve the reliability of the assembly, it has been considered necessary to make a certain new countermeasure.

Further, in the assembly in which the capacitor is embedded in the circuit board side, a circuit board added with value must be entirely thrown away even in the case only the capacitor is defective due to short or a defect of insulation resistance. For this reason, the amount of loss becomes large, thus making it difficult to manufacture the assembly at low cost.

Further, as a method of attaining low resistance and low inductance, it is considered to make the capacitor larger in size (i.e., larger in capacitance). However, in recent circuit boards, conductor circuits are, in many cases, formed so densely so as to lie over a plurality of layers so that there are not left in the circuit boards themselves any space in which such a large-sized capacitor is embedded. Further, if it is forcedly tried to embed a large-sized capacitor in the circuit board, the freedom in the formation of the conductor circuit becomes smaller, thus causing a possibility that formation of the conductor circuit becomes considerably difficult.

Further, there has heretofore been proposed nothing about the structure for connecting the IC chip and the mounting substrate of the IC package or the like by interposing therebetween an interposer.

It is accordingly an object of the present invention to provide an assembly of a semiconductor device, a capacitor and a substrate and an assembly of a semiconductor device, an interposer and a substrate that are excellent in the noise removing ability and can be produced with ease and at low cost.

It is another object of the present invention to provide a capacitor, a semiconductor device equipped capacitor assembly, a capacitor equipped substrate assembly, an interposer, a semi-conductor equipped interposer assembly and an interposer equipped substrate that are suited for use in the assembly of a semiconductor device, a capacitor and a substrate.

It is a further object of the present invention to provide an interposer to be interposed between an IC chip and an IC package which can provide a highly reliable electrical connection between the IC chip and the IC package.

It is a further object of the present invention to provide a method of producing an interposer of the foregoing character.

To achieve the above object, there is provided according to an aspect of the present invention an assembly comprising a semiconductor device having surface-connecting terminals, a substrate having surface-connecting pads, and a capacitor having an approximately plate-shaped capacitor main body having a first surface on which the semiconductor device is mounted and a second surface at which the capacitor main body is mounted on the substrate and a plurality of electrically conductive vias penetrating the capacitor main body between the first and second surfaces and connected to the surface-connecting terminals and the surface-connecting pads.

Further, as a suitable component or unit for realizing the above-described assembly, there is provided according to another aspect of the present invention a capacitor comprising an approximately plate-shaped capacitor main body having a first surface on which a semiconductor device having surface-connecting terminals is to be mounted and a second surface, and a plurality of electrically conductive vias penetrating the capacitor main body between the first and second surfaces for connection with the surface-connecting terminals. Further, as a component or unit for realizing the above-described assembly, there is provided according to a further aspect of the present invention a semiconductor device equipped capacitor assembly comprising a semiconductor device having surface-connecting terminals, and a capacitor having an approximately plate-shaped capacitor main body having a first surface on which the semiconductor device is mounted and a second surface and a plurality of electrically conductive vias penetrating the capacitor main body between the first and second surfaces and connected to the surface-connecting terminals. Further, as a suitable component or unit for realizing the above-described assembly, there is provided according to a further aspect of the present invention a capacitor equipped substrate assembly comprising a substrate having surface-connecting pads, and a capacitor having a plate-shaped capacitor main body having a first surface and a second surface and a plurality of electrically conductive vias penetrating the capacitor main body between the first and second surfaces and connected to the surface-connecting pads, the capacitor being mounted at the second surface on a surface of the substrate.

Accordingly, in the above-described assembly of a semiconductor device, a capacitor and a substrate, the capacitor itself has a function of an interposer and is disposed in the position where the interposer should be disposed. Namely, as compared with the conventional structure, the semiconductor device and the capacitor are disposed closer and directly connected to each other. By this effect, the wiring connecting between the semiconductor device and the capacitor (capacitor connecting wiring) can be considerably shorter or can be completely eliminated. Accordingly, it becomes possible to reduce the noise that intrudes into a wiring between the semiconductor device and the capacitor considerably and prevent a defect such as an erroneous operation, thus making it possible to attain a high reliability in operation.

Further, in case the capacitor is defective, it will do to throw away the capacitor only since the capacitor is not embedded in the circuit substrate side, so that it is not necessitated to throw away the entire circuit substrate. Accordingly, as compared with the convention structure in which the capacitor is embedded in the circuit substrate side, the loss of money can be decreased and therefore the semiconductor package can be produced at low cost. Furthermore, since the capacitor is not embedded in the circuit substrate side, it is free from the restriction of space and therefore can be large-sized (i.e., increased in the capacity) relatively easily, while at the same time the circuit substrate itself can be produced with ease.

The semiconductor device herein used is of the type having surface-connecting terminals. The surface-connecting terminal is intended to indicate a terminal for electrical connection and adapted to attain the electrical connection by surface-to-surface joining. In the meantime, the surface-to-surface joining indicates such a case in which pads or terminals are arranged in linear array or grid array (including zigzag array) on the flat surfaces of articles and joined together to electrically connect the articles to each other. The semiconductor device is not limited in size and shape but is preferably large-sized so as to be 10 mm or larger at one side. Further, the thermal expansion coefficient of the semiconductor device is preferably equal to or larger than 2.0 ppm/° C. and smaller than 5.0 ppm/° C. As a concrete example of such a semiconductor device is enumerated a semiconductor integrated circuit chip (IC chip) made of silicon of the thermal expansion coefficient of about 5.0 ppm/° C.

The term "thermal expansion coefficient" is herein used to indicate the thermal expansion coefficient (CTE) in the direction (XY direction) crossing the thickness direction (z direction) at right angles while indicating a value measured by TMA (Thermal Machine Analysis) at the temperature from 0 to 100° C. "TMA" is an analysis prescribed, for example, in Japan Printed Circuit Association standard (JPCA-BU01).

The substrate described above is of the type having surface-connecting pads. An example of such a substrate is a substrate on which semiconductor devices and other electronic parts are mounted, particularly a circuit substrate on which semiconductor devices and other electronic parts are mounted and which has a conductor circuit electrically connecting the semiconductor devices and electronic parts to each other. The material for forming the substrate is not limited but can be selected accordingly with consideration of the cost, machinability, insulation ability, mechanical strength, etc. As the substrate described above are enumerated, for example, a resin substrate, ceramic substrate, metallic substrate, etc.

As a concrete example of a resin substrate are enumerated an EP (epoxy) resin substrate, PI (polyimide) resin substrate, BT (bismaleimide triazin) resin substrate, PPE (polyphenylene ether) resin substrate, etc. Further, substrates made of composite materials of the resins described above and glass fiber (woven glass fiber or unwoven glass fiber) or organic fiber such as polyamide fiber can be used. Further, a substrate made of a composite material obtained by impregnating a thermosetting resin such as epoxy resin in a three-dimension network-shaped fluoroplastic base such as continuously porous PTFE (polytetrafluoroethylene) can be used. As a concrete example of the ceramic substrate described above are enumerated an alumina substrate, beryllia substrate, glass ceramic substrate, substrate made of a low-temperature firing material such as crystallized glass. As a concrete example of the metallic substrate described above are enumerated a copper substrate, copper alloy substrate, a substrate made of a single metal other than copper, a substrate made of an alloy of a metal other than copper, etc. In the meantime, almost all of the resin substrates and ceramic substrates have a thermal expansion coefficient of 5.00 ppm/° C. or larger.

Further, the surface-connecting pad is a terminal pad for electrical connection and adapted to attain the electrical connection by surface-to-surface joining. Such surface-connecting pads are arranged, for example, in linear array or grid array (including zigzag array).

The capacitor described above is a so-called via array type capacitor including a capacitor main body and a plurality of electrically conductive vias. In this kind of capacitor, a first inner layer electrode electrically connected to a first electrically conductive via and a second inner layer electrode electrically connected to a second electrically conductive via are alternately stacked within dielectric layers constituting the capacitor main body.

The electrically conductive vias described above penetrate the capacitor main body between the first surface and the second surface thereof and are electrically connected at one ends to the surface-connecting terminals and at the other ends to the surface-connecting pads. Such electrically conductive vias are formed by disposing a column of an electrically conductive material within each of via holes penetrating the capacitor main body. The electrically conductive material is not limited to particular one but as the electrically conductive material are enumerated, for example, a metal containing one or more metals selected from the group consisting of copper, gold, silver, platinum, palladium, nickel, tin, lead, solder, tungsten, molybdenum and titan. Further, the electrically conductive via can be formed by a known technique, for example, by filling a paste containing an electrically conductive metal in the via holes, plating the via holes with an electrically conductive metal or press-fitting electrically conductive metal members in the form of a pin in the via holes. In the meantime, in case the electrically conductive vias are formed by filling an electrical conductive paste in the via holes penetrating the capacitor main body, a method of sintering the ceramic substrate and the paste at the same time (simultaneous sintering method) may be employed or a method of first sintering the ceramic substrate and thereafter performing filling and sintering of the paste (post-sintering method) may be employed.

It will do to select the shape of the electrically conductive via in accordance with a surface-connecting terminal or a surface-connecting pad to which the electrically conductive via is connected. For example, in case the surface-connecting terminal or pad is flat, it is preferable that the electrically conductive via has end portions protruding from the first and second surfaces, i.e., end portions in the form of bump. In the meantime, for joining of the electrically conductive via and the surface-connecting terminal or pad, a method of holding their end surfaces opposed to each other and joining them together by using an electrically conductive material such as solder and electrically conductive resin can be employed.

The dielectric layers of the capacitor main body are formed by using a ceramic material. As a suitable material, for example, an oxide system ceramic such as $PbTiO_2$, $BaTiO_3$, $SrTiO_3$ and $TiO_2$ but non-oxide system ceramic (e.g., ceramic of a nitride system) may be selected.

The thermal expansion coefficient of the capacitor main body is not limited but preferably smaller than that of the substrate and less than 20.0 ppm/° C., more preferably less than 10.0 ppm/° C. In the meantime, the thermal expansion coefficient of the capacitor main body is preferably not less than 2.0 ppm/° C. and less than 20.0 ppm/° C. and more preferably not less than 2.0 ppm/° C. and less than 10.0 ppm/° C. Still more preferably, the thermal expansion coefficient of the capacitor main body is in the range not less than 2.0 ppm/° C. and less than 10.0 ppm/° C., while being nearly equal to or larger than that of the semiconductor device. This is because when the thermal expansion coefficient of the capacitor main body is 10.0 ppm/° C. or less, the difference in the thermal expansion coefficient between the capacitor main body and the semiconductor device becomes sufficiently small, thus making it possible to reduce an influence of thermal stress on the semiconductor device sufficiently. Accordingly, in case an IC chip made of silicon of the thermal expansion coefficient of about 3.0 ppm/° C. is selected, it is preferable to use a capacitor main body of the thermal expansion coefficient not less than 3.0 ppm/° C. and less than 5.0 ppm/° C.

Further, it is preferable that the capacitor main body not only has a low expansion property as described above but a high rigidity (e.g., high Young's modulus). Namely, it is preferable that the rigidity (e.g., Young's modulus) of the capacitor main body is at least higher than that of the semiconductor device and specifically the Young's modulus is 200 GPa or more, particularly 300 GPa or higher. This is because when the capacitor main body has a high rigidity, it can withstand a thermal stress even if the thermal stress is large. Accordingly, it becomes possible to prevent bending of the capacitor main body itself and a crack or cracks at the joint between the substrate main body and the semiconductor device.

Further, it is preferable that the capacitor main body not only has a low thermal expansion property and a high rigidity as described above but a high heat emission property. Herein, "high heat emission property" means that the capacitor main body has at least a heat-emission property (e.g., heat transfer rate) higher than that of the substrate. This is because when the capacitor main body having a high heat-emission property is used it becomes possible to transmit the heat generated by the semiconductor device and thereby emit the same rapidly, thus making it possible to mitigate the thermal stress. Accordingly, the capacitor main body is not subjected to a large thermal stress, thus making it possible to prevent bending of the capacitor main body and a crack or cracks at the joint between the substrate main body and the semiconductor device.

Further, it is preferable that the capacitor main body has an insulation ability. This is because if the capacitor main body does not have an insulation ability, it is necessary to provide the dielectric layers with insulation layers beforehand at the time the electrically conductive vias and electrodes are formed. Accordingly, it becomes possible to prevent the complexity in structure and increase in the work time.

From the foregoing, it will be understood that the capacitor main body is preferably formed from an engineering ceramic material of the nitride system and having an insulation ability and most preferably formed from aluminum nitride, silicon nitride or a mixed ceramic material of aluminum nitride and silicon nitride. This is because the materials described above have a low thermal expansion property, high rigidity, high heat-emission ability and an insulation ability. For example, the thermal expansion coefficient of aluminum nitride is about 4.4 ppm/° C. and Young's modulus is about 350 GPa. The thermal expansion coefficient of silicon nitride is about 3.0 ppm/° C. and Young's modulus is about 300 GPa.

According to a further aspect of the present invention, there is provided an assembly comprising a semiconductor device having surface-connecting terminals, a substrate having surface-connecting pads, and an interposer having an approximately plate-shaped interposer main body having a first surface on which the semiconductor device is mounted and a second surface formed with a recess, the interposer main body being mounted at the second surface on the substrate, the interposer further having a plurality of interposer main body side electrically conductive vias penetrating the interposer main body between the first surface and a bottom surface of the recess and electrically connected to the surface-connecting terminals and a capacitor disposed in the recess and having front and rear surfaces and a plurality of capacitor side electrically conductive vias passing through the front and rear surfaces and electrically connected to the interposer main body side electrically conductive vias and the surface-connecting pads.

As a suitable component or unit for realizing the assembly of a semiconductor device, an interposer and a substrate, there is provided according to a further aspect of the present invention an interposer comprising an approximately plate-shaped interposer main body having a first surface on which a semiconductor device having surface-connecting terminals is mounted and a second surface formed with a recess, a plurality of interposer main body side electrically conductive vias penetrating the interposer main body between the first surface and a bottom surface of the recess and electrically connected to the surface-connecting terminals, and a capacitor disposed in the recess and having front and rear surfaces and a plurality of capacitor side electrically conductive vias passing through the front and rear surfaces and electrically connected to the interposer main body side electrically conductive vias. Further, as a suitable component or unit for realizing the assembly of a semiconductor device, an interposer and a substrate, there is provided according to a further aspect of the present invention a semiconductor device equipped interposer assembly comprising a semiconductor device having surface-connecting terminals, and an interposer having an interposer main body having a first surface on which a semiconductor device having surface-connecting terminals is mounted and a second surface formed with a recess, a plurality of interposer main body side electrically conductive vias penetrating the interposer main body between the first surface and a bottom surface of the recess and electrically connected to the surface-connecting terminals, and a capacitor disposed in the recess and having front and rear surfaces and a plurality of capacitor side electrically conductive vias passing through the front and rear surfaces and electrically connected to the interposer main body side electrically conductive vias. Further, as a suitable component or unit for realizing the assembly of a semiconductor device, an interposer and a substrate, there is provided according to a further aspect of the present invention an interposer equipped substrate assembly comprising a substrate having surface-connecting pads, an interposer having an approximately plate-shaped interposer main body having a first surface and a second surface formed with a recess, the interposer main body being mounted at the second surface on the substrate, a plurality of interposer main body side electrically conductive vias penetrating the interposer main body between the first and second surfaces and electrically connected to the surface-connecting pads and a capacitor disposed in the recess and having front and rear surfaces and a plurality of capacitor side electrically conductive vias passing through the front and rear surfaces and electrically connected to the interposer main body side electrically conductive vias.

Accordingly, by the assembly described above, the capacitor is disposed within the recess of the interposer, thus making it possible to make the semiconductor device and the capacitor come closer as compared with the conventional structure and resultantly enabling the wiring (capacitor connection wiring) connecting between the semiconductor device and the capacitor to be considerably shorter. Accordingly, it becomes possible to make considerably smaller the noise that intrudes at the joint between the semiconductor device and the capacitor and thereby prevent an erroneous operation and attain a high reliability in operation.

Further, in case the capacitor is defective, it will do to throw away the capacitor only since the capacitor is not embedded in the circuit substrate side, so that it is not necessitated to throw away the entire circuit substrate. Accordingly, as compared with the convention structure in which the capacitor is embedded in the circuit substrate side, the loss of money can be decreased and therefore the semiconductor package can be produced at low cost. Furthermore, since the capacitor is not embedded in the circuit substrate side, it is free from the restriction of space and therefore can be large-sized (i.e., increased in the capacity) relatively easily, while at the same time the circuit substrate itself can be produced with ease.

With respect to the semiconductor device and the substrate, similar ones to those of the assembly of a semiconductor device, a capacitor and a substrate can be used.

The interposer has an approximately plate-shaped interposer main body. The interposer main body has a first surface and a second surface. On the first surface is mounted the semiconductor device, and at the second surface the interposer is mounted on the surface of the substrate. Further, the second surface of the interposer main body is formed with the recess for disposition of the capacitor. A single recess or a plurality of recesses will suffice. Further, the recess is not particularly limited in the shape and size so long as it can be disposed within the recess. In the meantime, the bottom surface and side surfaces of the recess that has an open end at the second surface are considered to constitute part of the second surface.

It is preferable that the thermal expansion coefficient of the interposer main body is smaller than that of the substrate and specifically less than 10.0 ppm/° C. In the meantime, the thermal expansion coefficient of the interposer main body is preferably 2.0 ppm/° C. or more and less than 5.0 ppm/° C. More preferably, the thermal expansion coefficient of the capacitor main body is in the range not less than 2.0 ppm/° C. and less than 5.0 ppm/° C., while being nearly equal to or larger than that of the semiconductor device. This is because when the thermal expansion coefficient of the capacitor main body is 10.0 ppm/° C. or more (particularly less than 5.0 ppm/° C.), the difference in the thermal expansion coefficient between the interposer main body and the semiconductor device becomes sufficiently small, thus making it possible to reduce an influence of thermal stress on the semiconductor device sufficiently. Accordingly, in case an IC chip made of silicon of the thermal expansion coefficient of about 3.0 ppm/° C. is selected, it is preferable to use an interposer main body of the thermal expansion coefficient not less than 3.0 ppm/° C. and less than 5.0 ppm/° C. In the meantime, it is more preferable that the interposer main body has a smaller thermal expansion property that the capacitor. When this is the case, even if a capacitor of a large thermal expansion coefficient is used, the thermal expansion coefficient of the entire interposer can be lowered by the use of the interposer main body described above.

Further, it is preferable that the interposer main body not only has a low expansion property as described above but a high rigidity (e.g., high Young's modulus). Namely, it is preferable that the rigidity (e.g., Young's modulus) of the interposer main body is at least higher than that of the semiconductor device and specifically the Young's modulus is 200 GPa or more, particularly 300 GPa or more. This is because when the interposer main body has a high rigidity, it can withstand a thermal stress even if the thermal stress is large. Accordingly, it becomes possible to prevent bending of the interposer main body itself and a crack or cracks at the joint between interposer main body and the semiconductor device.

Further, it is preferable that the interposer main body not only has a low thermal expansion property and a high rigidity as described above but a high heat emission property. This is because when the interposer main body having a high heat-emission property is used it becomes possible to transmit the heat generated by the semiconductor device and thereby emit the same rapidly, thus making it possible to mitigate the thermal stress. Accordingly, the interposer main body is not subjected to a large thermal stress, thus making it possible to prevent bending of the interposer main body and a crack or cracks at the joint between the interposer main body and the semiconductor device.

Further, it is preferable that the interposer main body has an insulation ability. This is because if the interposer main body does not have an insulation ability, it is necessary to provide the interposer main body with insulation layers beforehand at the time the electrically conductive vias are formed. Accordingly, it becomes possible to prevent the complexity in structure and increase in the work time.

From the foregoing, it will be understood that the interposer main body is preferably formed from an engineering ceramic material of the nitride system and having an insulation ability and most preferably formed from aluminum nitride, silicon nitride or a mixed ceramic material of aluminum nitride and silicon nitride. This is because the materials described have a low thermal expansion property, high rigidity, high heat-emission ability and an insulation ability.

It is true that a ceramic material of an alumina system causes a large thermal expansion as compared with an insulating engineering ceramic material of a nitride system but it has a desired thermal and mechanical physical property and suited as a material for forming the interposer main body. The ceramic material of the alumina system has an advantage that it is lower in price than the insulating engineering ceramic material of the nitride system. Further, a low-temperature sintering ceramic material whose thermal expansion is small can be used as a material for forming the interposer main body, though inferior in the mechanical physical property to the ceramic material of the alumina system. In the meantime, from the point of view of a small resistance of the electrically conductive vias, it is preferable to use a low-temperature sintering ceramic material such as glass ceramic and crystallized glass as a material for forming the interposer main body. This is because a low-temperature sintering ceramic material enables the electrically conductive vias to be formed from copper or silver that is a good electrical conductor.

The interposer has a plurality of interposer main body side electrically conductive vias. The interposer main body side electrically conductive vias penetrate the interposer main body between the first surface and the bottom surface of the recess and are electrically connected at one ends to the surface-connecting terminals and at the other ends to the capacitor side electrically conductive vias. In the meantime, the interposer may further has interposer main body side electrically conductive vias penetrating a region of the interposer main body other than the region where the recess is formed, between the first and second surfaces and electrically connected at one ends to the surface-connecting terminals and at the other ends to the surface-connecting pads.

Further, the interposer has the capacitor including the plurality of capacitor side electrically conductive vias, i.e., a so-called via-array type capacitor. The capacitor side electrically conductive vias are formed so as to penetrate the capacitor between the front surface and the rear surface and electrically connected at one ends to the interposer main body side electrically conductive vias and at the other ends to the surface-connecting pads.

The interposer main body side electrically conductive vias and the capacitor side electrically conductive vias are formed by disposing a column of an electrically conductive material within each of via holes penetrating the interposer main body or the capacitor. The electrically conductive material is not limited to particular one but as the electrically conductive materially are enumerated, for example, a metal containing one or more metals selected from the group consisting of copper, gold, silver, platinum, palladium, nickel, tin, lead, solder, tungsten, molybdenum and titan. Further, the interposer main body side electrically conductive vias and the capacitor side electrically conductive vias can be formed by a known technique, for example, by filling a paste containing an electrically conductive metal in the via holes, plating the via holes with an electrically conductive metal or press-fitting electrically conductive metal members in the form of a pin in the via holes. In the meantime, in case the electrically conductive vias are formed by filling an electrical conductive paste in the via holes penetrating the interposer main body or the capacitor, a simultaneous sintering method may be employed or a post-sintering method may be employed.

The shape of the interposer main body side electrically conductive vias is selected suitably in accordance with the shapes of the surface-connecting terminals, the capacitor side electrically conductive vias and the surface-connecting pads to which the interposer main body side electrically conductive vias are connected. Further, the shape of the capacitor side electrically conductive vias is selected suitably in accordance with the shapes of the interposer main body side electrically conductive vias and the surface-connecting pads.

In the meantime, it is preferable to allot the plurality of interposer main body side electrically conductive vias that penetrate the interposer main body between the first surface and the bottom surface of the recess and are electrically connected at one ends to the surface-connecting terminals and at the other ends to the capacitor side electrically conductive vias, for example, to a plurality of interposer main body side electrically conductive ground vias and a plurality of interposer main body side electrically conductive power vias. Both of the two kinds of interposer main body side electrically conductive vias are disposed within the region of the interposer main body where the recess is formed. On the other hand, it is preferable to allot the interposer main body side electrically conductive vias that penetrate the region of the interposer main body other than the region where the recess is formed (i.e., the region around the recess) and are electrically connected at one ends to the surface-connecting terminals and at the other ends to the surface-connecting pads, for example, to interposer main body side electrically conductive vias for signal lines. This is because generally in the semiconductor device the surface-connecting terminals for signal lines are disposed around the surface-connecting ground terminals and the surface-connecting power terminals, so that the above-described arrangement of vias on the interposer side is made so as to correspond to the arrangement of terminals on the semiconductor side.

In this instance, the plurality of capacitor side electrically conductive vias described above preferably include capacitor side electrically conductive ground vias and capacitor side electrically conductive power vias. In the meantime, the capacitor side electrically conductive ground vias are electrically connected to the interposer main body side electrically conductive ground vias. The capacitor side electrically conductive power vias are electrically connected to the interposer main body side electrically conductive power vias.

In the meantime, a plurality of electrically conductive short ground vias penetrating the interposer main body between the first surface and the bottom surface of the recess and via pitch changing layers may be formed inside the interposer main body, and at least part of the short ground vias may be electrically connected to the above-described capacitor side ground vias by way of the via pitch changing layers. Herein, the via pitch changing layers indicate electrical conductors in layers and provided for changing the pitch of the capacitor side electrically conductive ground vias (the distance between the centers of adjacent capacitor side ground vias). One or more via pitch changing layers are formed inside the interposer main body. Further, the electrically conductive short ground vias indicate the vias that are shorter than the above-described interposer main body side electrically conductive vias allotted to the ground vias and cannot reach the second surface. Accordingly, the electrically conductive short ground vias do not penetrate the interposer main body between the first and second surfaces. At least some of the electrically conductive short ground vias are electrically connected at inner portions thereof to the via pitch changing layers.

Generally, the pitch of the interposer main body side electrically conductive ground vias (i.e., the distance between the centers of adjacent interposer main body side electrically conductive ground vias) is restricted by the pitch of the surface-connecting terminals of the semiconductor device. Accordingly, if it is tried to electrically connect the interposer main body side electrically conductive ground vias and the capacitor side electrically conductive ground vias to each other without interposing therebetween the above-described kind of via pitch changing layers, the pitch of the capacitor side electrically conductive ground vias are restricted by the pitch of the surface-connecting terminals. However, such a restriction makes it difficult to attain desired capacitance and inductance characteristics, leading to the possibility that a desired function cannot be given to the interposer.

In contrast to this, by electrically connecting at least part of the electrically conductive short ground vias to the capacitor side electrically conductive ground vias by way of the via pitch changing layers, the freedom in the arrangement of the capacitor side electrically conductive ground vias is basically increased. Accordingly, desired capacitance and inductance characteristics can be attained with ease, thus making it easier to give a desired function to the interposer. Further, this structure makes it possible to thin out the capacitor side electrically conductive ground vias, i.e., to thin out the density of the capacitor side electrically conductive ground vias.

In the meantime, a plurality of electrically conductive power vias penetrating the interposer main body between the first surface and the bottom surface of the recess and via pitch changing layers may be formed within the interposer main body, and at least part of the electrically conductive power vias is connected to the capacitor side electrically conductive power vias by way of the via pitch changing layers. Herein, the via pitch changing layers indicate electrical conductors in layers and provided for changing the pitch of the capacitor side electrically conductive ground vias (the distance between the centers of adjacent capacitor side ground vias). One or more via pitch changing layers are formed inside the interposer main body. Further, the electrically conductive short power vias indicate the vias that are shorter than the above-described interposer main body side electrically conductive vias allotted to the power vias and cannot reach the second surface. Accordingly, the electrically conductive short power vias do not penetrate the interposer main body between the first and second surfaces. At least part of the electrically conductive short power vias is electrically connected at inner portions thereof to the via pitch changing layers.

Generally, the pitch of the interposer main body side electrically conductive power vias (i.e., the distance between the centers of adjacent interposer main body side electrically conductive power vias) is restricted by the pitch of the surface-connecting terminals of the semiconductor device. Accordingly, if it is tried to electrically connect the interposer main body side electrically conductive power vias and the capacitor side electrically conductive power vias to each other without interposing therebetween the above-described kind of via pitch changing layers, the pitch of the capacitor side electrically conductive power vias is restricted by the pitch of the surface-connecting terminals. Such a restriction makes it difficult to attain desired capacitance and inductance characteristics, leading to the possibility that a desired function cannot be given to the interposer.

In contrast to this, by electrically connecting at least part of the electrically conductive short power vias to the capacitor side electrically conductive ground vias by way of the via pitch changing layers, the freedom in the arrangement of the capacitor side electrically conductive power vias is basically increased. Accordingly, desired capacitance and inductance characteristics can be attained with ease, thus making it easier to give a desired function to the interposer. Further, this structure makes it possible to thin out the capacitor side electrically conductive power vias, i.e., to thin out the density of the capacitor side electrically conductive power vias.

Further, the interposer main body and the capacitor may be structured integrally so as to constitute an integral unit so that the interposer main body side electrically conductive vias and the capacitor side electrically conductive vias are directly connected to each other without interposing therebetween projection electrodes. In case of such an integral structure being employed, projection electrodes for electrically connecting the interposer main body and the capacitor can be dispensed with, thus making it possible to simplify the structure. Further, by directing connecting the interposer main body side electrically conductive vias and the capacitor side electrically conductive vias to each other, it becomes possible to make lower the resistance of the interposer. In the meantime, an interposer having an interposer main body and a capacitor that are structured integrally can be produced by, for example, stacking unsintered ceramic layers and sintering them simultaneously.

Further, the interposer main body and the capacitor can be structured separately so that the interposer main body side electrically conductive vias and the capacitor side electrically conductive vias are electrically connected by way of projection electrodes. In case of such a separate structure being employed, the freedom in selection of the materials for forming the interposer main body and the capacitor and in selection of the method of producing the interposer can be increased.

According to a further aspect of the present invention, there is provided an interposer for electrical connection between a semiconductor device and a package in which the semiconductor device is mounted, comprising a capacitor portion having a dielectric layer between inner layer electrodes, and a surrounding portion surrounding a lateral periphery of the capacitor portion and made of a material having a thermal expansion coefficient smaller than that of the dielectric layer.

The above-described interposer is provided with a capacitor portion having a dielectric layer between inner layer electrodes, and a surrounding portion surrounding a lateral periphery of the capacitor portion and made of a material having a thermal expansion smaller than that of the dielectric layer. For this sake, in case a rise of the temperature around the capacitor portion causes a thermal expansion of the dielectric layer, the thermal expansion of the dielectric layer is restricted or suppressed by the surrounding portion since the thermal expansion of the surrounding portion of a smaller thermal expansion coefficient is small. Accordingly, it occurs less frequently that a stress is applied at the joint between the semiconductor device and the package due to the thermal expansion of the dielectric layer.

It is more preferable that the surrounding portion has a high Young's modulus, e.g., 200 GPa, preferably 300 GPa.

By the high Young's modulus, a deformation of the surrounding portion caused when a high thermal stress is applied from the package, or the like to the surrounding portion is small, thus making it possible to restrict or suppress the thermal expansion of the dielectric more efficiently.

The surrounding portion may be structured so as to surround all of the lateral periphery of the capacitor portion. By this, the thermal expansion of the dielectric can be restricted or suppressed sufficiently, thus making it possible to make further higher the reliability in the connection between the semiconductor device and the package.

It is preferable that the thermal expansion coefficient of the material forming the surrounding portion is equal to or smaller than 10 ppm/° C. By this, thermal expansion of the surrounding portion is hard to be caused in response to a rise of the temperature around the capacitor portion, thus making it possible to make wider the temperature range in which the thermal expansion of the dielectric is restricted or suppressed effectively. As an example of such a material can be enumerated alumina or the like.

A wiring for electrical connection between the IC device and the package may be formed so as to penetrate at least partially the surrounding portion. By this, the region for connection with the semiconductor device and the package can be widened over the surrounding portion, thus enabling the interposer to be connected with a larger semiconductor device and package. In case the wiring is formed further in the surrounding portion as described above, it is preferable that the surrounding portion is made of a material having a specific inductive capacity lower than that of the dielectric (e.g., 15 or less). By this, it becomes possible to prevent capacity coupling of wires of the wiring provided to the surrounding portion and thereby prevent transmission of erroneous signals between the semiconductor device and the package through the wires provided to the surrounding portion.

The interposer may be equipped with the semiconductor device or the package beforehand. As an example of such an assembly can be considered a semiconductor equipped interposer assembly in which a semiconductor device is connected to the wiring of the interposer, an interposer equipped package assembly in which a package is connected to the wiring of the interposer, and an assembly in which the semiconductor device and the package are connected by interposing therebetween the interposer.

According to a further aspect of the present invention, there is provided a method of producing an interposer for electrical connection between a semiconductor device and a package in which the semiconductor device is mounted, the interposer including a capacitor portion having a dielectric layer between inner layer electrodes, the method comprising forming a surrounding portion that surrounds the capacitor portion from a material having a thermal expansion coefficient smaller than that of the dielectric layer.

By the method of producing the interposer, a surrounding portion that surrounds the capacitor portion is formed from a material having a thermal expansion coefficient smaller than that of the dielectric layer. Accordingly, an interposer that is capable of maintaining a good condition of connecting between the semiconductor device and the package even when a thermal expansion of the dielectric layer is caused by a rise of the temperature around the semiconductor device can be produced.

The above-described step of forming the surrounding portion may comprise forming the surrounding portion integrally with the capacitor portion. By this, it becomes possible to produce an interposer in which the capacitor portion and the surrounding portion are fitted together with an increased assuredness.

The above-described step of forming the surrounding portion may comprise fitting the capacitor portion in the surrounding portion. By this, the capacitor portion and the surrounding portion can be produced separately. Accordingly, various kinds of capacitor portions can be combined with various kinds of surrounding portions to produce various kinds of interposers.

DESCRIPTION OF THE PREFERRED EMBODIMENTS

First Embodiment

Figure 1:
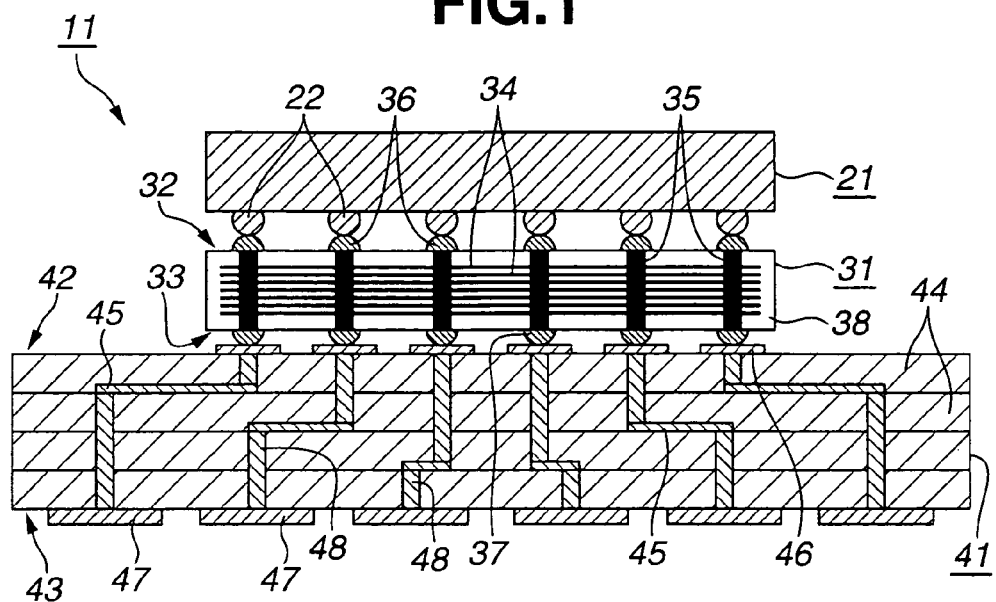
FIG. 1 is a schematic sectional view of a semiconductor package (assembly) consisting of an IC chip (semiconductor device), capacitor and a circuit substrate (substrate) according to an embodiment of the present invention.
Figure 5:
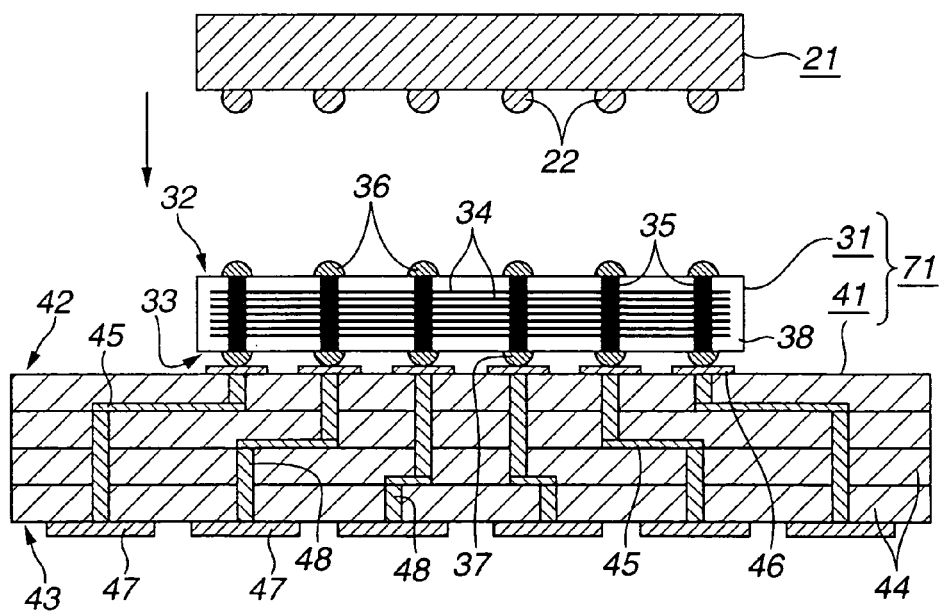
FIG. 5 is a schematic sectional view illustrating mounting of an IC chip on a capacitor equipped circuit substrate (capacitor equipped substrate assembly) according to a modification of the first embodiment.

Referring first to FIGS. 1 and 5, a semiconductor package (an assembly of a semiconductor device, a capacitor and a substrate) according to a first embodiment of the present invention is generally indicated by 11 and of the LGA (land grid array) type including an IC chip (semiconductor device) 21, a capacitor 31 and a circuit substrate (substrate) 41. In the meantime, the semiconductor package 11 is not limited to the LGA type but can be of any other type such as BGA (ball grid array) type and PGA (pin grid array) type. The IC chip 21 having a function of MPU (micro processing unit) is in the form of a flat plate of 10 mm square and made of silicon of thermal expansion coefficient of about 3.0 ppm/° C. On the upper side surface of the IC chip 21 is formed a circuit element (not shown). On the other hand, on the lower side surface of the IC chip 21 is formed a plurality of surface-connecting terminals 22 in the form of bumps.

The circuit substrate 41 is in the form of a square flat plate and has an upper surface 42 and a lower surface 43. The circuit substrate 41 is a so-called multilayer circuit board and includes a plurality of resinous insulation layers 44 and a plurality of conductor circuits 45. In this embodiment, each resinous insulation layer 44 is formed from an insulation material made up of glass cloth impregnated with epoxy resin. Each conductor circuit 45 is made of copper film or copper-plating layer. The thermal expansion coefficient of such a circuit substrate 41 ranges from 13.00 ppm/° C. to 16.00 ppm/° C. On the upper surface 42 of the circuit substrate 41 are formed surface-connecting pads 46 that are arranged in a grid array. On the lower surface 43 of the circuit substrate 41 are formed a plurality of surface-connecting pads 47 that are arranged in a grid array for electrical connection with a mother board (not shown). In the meantime, the surface-connecting pads 47 for electrical connection with the mother board are arranged at larger pitches than those of the surface-connecting pads 46 for electrical connection with the capacitor 31. The resinous insulation layers 44 are provided with electrically conductive vias 48 so that the conductor circuits 45, surface-connecting pads 46 and the surface-connecting pads 47 that are provided to the different insulation layers 44 are electrically connected to each other by way of the electrically conductive vias 48. Further, on the upper surface of the circuit substrate 41 are mounted other semiconductor devices and electronic parts (not shown) in addition to an IC chip equipped capacitor (semiconductor device equipped capacitor assembly) 61.

Figure 2:
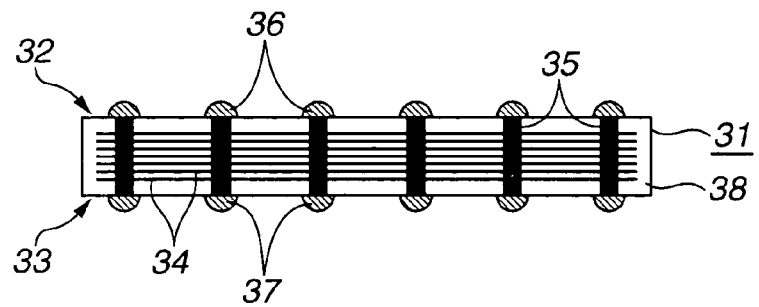
FIG. 2 is a schematic sectional view of the capacitor of FIG. 1.
Figure 3:
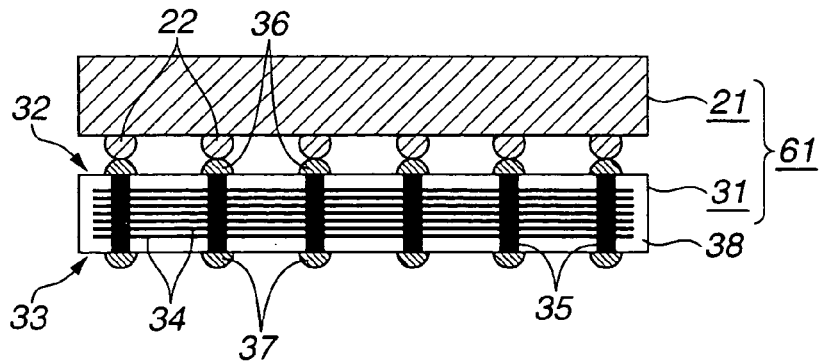
FIG. 3 is a schematic sectional view of an IC chip equipped capacitor (semiconductor device equipped capacitor assembly) constituting the semiconductor package of FIG. 1.

As shown in FIGS. 1 and 2, the above-described capacitor 31 is of the via array type and includes a capacitor main body 38 in the form of a square flat plate and having an upper surface (first or front surface) 32 and a lower surface (second or rear surface) 33. The capacitor main body 38 is formed from an aluminum nitride substrate having a multilayer structure. Namely, the capacitor 31 is a laminated ceramic capacitor. Such an aluminum nitride substrate has a thermal expansion coefficient of about 4.4 ppm/° C. and a Young's modulus of about 350 Gpa. Accordingly, the thermal expansion coefficient of the capacitor main body 38 is smaller than that of the circuit substrate 41 and larger than that of the IC chip 21. That is, the capacitor 31 of this embodiment has a thermal expansion character lower than that of the circuit substrate 41 and rather close to that of the IC chip 21. Further, since the Young's modulus of the aluminum nitride substrate is higher than that of the IC chip 21, the capacitor 31 of this embodiment has a high rigidity.

The capacitor main body 38 constituting the capacitor 31 has a plurality of via holes (through holes) extending between the upper surface 32 and the lower surface 33 and arranged in a grid array. The vias correspond in position to the respective surface-connecting pads 46 of the circuit substrate 41. Within such via holes are provided a plurality of electrically conductive vias 35 made of W (tungsten) that is a kind of high melting point metal. At an upper end surface of each via 35 is provided an upper end side bump 36 having a nearly semi-spherical shape. The upper end side bumps 36 protrude upward from the upper surface 32 and are connected to the surface-connecting terminals 22 on the IC chip 21 side. At the lower end surface of each electrically conductive via 35 is provided a lower end side bump 37. The lower end side bumps 37 protrude downward from the lower surface 33 and are connected to the surface-connecting pads 46 on the circuit substrate 41 side.

Further, in the aluminum nitride substrate constituting the capacitor main body 38 are disposed inner layer electrodes 34 that are arranged in the form of stacked layers by way of aluminum nitride layers that are dielectric layers. More specifically, the electrically conductive vias 35 are classified into three groups, i.e., first electrically conductive vias, second electrically conductive vias and third electrically conductive vias. The inner layer electrodes are classified into two groups, i.e., first inner layer electrodes and second inner layer electrodes. The first inner layer electrodes and the second inner layer electrodes are stacked alternately with predetermined distances therebetween. The first inner electrodes are connected to the first electrically conductive vias and the second inner electrodes are connected to the second electrically conductive vias. In the meantime, the third electrically conductive vias are not connected any of the inner layer electrodes.

Accordingly, in the semiconductor package 11 structured as above, the circuit substrate 41 side and the IC chip 21 side are electrically connected by way of the electrically conductive vias 35 of the capacitor 31. Thus, transmission of a signal is performed between the circuit substrate 41 and the IC chip 21 by way of the capacitor 31 that also has a function of an interposer, while a power for operating the IC chip 21 as MPU is supplied. In this case, the above-described signal is inputted through the third electrically conductive vias, and the above-described power is supplied through the first electrically conductive vias and the second electrically conductive vias. Since the semiconductor package 11 is provided with the capacitor 31, the noise that is otherwise superposed on the power potential and the ground potential can be removed assuredly. In the meantime, while the semiconductor package 11 of this embodiment is provided with only one capacitor 31, this is not for the purpose of limitation but it can be provided with a plurality of capacitors 31.

The method of producing the semiconductor package 11 will now be described.

Firstly, by using a known ceramic green sheet forming technique, a plurality of aluminum nitride green sheets are prepared. Then, at predetermined positions of each green sheet are formed via holes that penetrate the green sheet between the front and rear surfaces by punching or the like processing. Further, within the via holes of each green sheet are filled W paste thereby forming filled paste layers that are to be formed into the electrically conductive vias 35. Further, on one side of each green sheet is printed W paste thereby forming a printed paste layer of a predetermined pattern that is later to be formed into the inner layer electrode 34. Then, the green sheets are stacked and compressed to be joined together. Thereafter, the green sheets are sintered (i.e., sintered simultaneously) in an reducing atmosphere at a predetermined temperature thereby sintering aluminum nitride and w paste. As a result, the capacitor main body 38 having the electrically conductive vias 35 and the inner layer electrodes 34 is produced. Further, on the opposite surfaces of each of the electrically conductive vias 35 of the capacitor main body 38 are printed masses of solder paste. Then, the printed masses of solder paste on the opposite surfaces of each of the electrically conductive vias 35 are melted. The masses of solder paste are thus caused to bulge out and formed into a semi-spherical shape thereby being formed into bumps 36 at upper surface side and bumps 37 at the lower surface side. Resultantly, the capacitor 31 of FIG. 2 is completed.

Then, on the upper surface 32 of the thus completed capacitor 31 is mounted the IC chip 21. At this time, the surface-connecting terminals 22 at the IC chip 21 side and the upper surface side bumps 36 at the capacitor 31 side are aligned with each other. Then, the upper surface side bumps 36 are heated to reflow and thereby joined to the respective surface-connecting terminals 22. As a result, an IC chip equipped capacitor (semiconductor device equipped capacitor assembly) 61 is completed.

Figure 4:
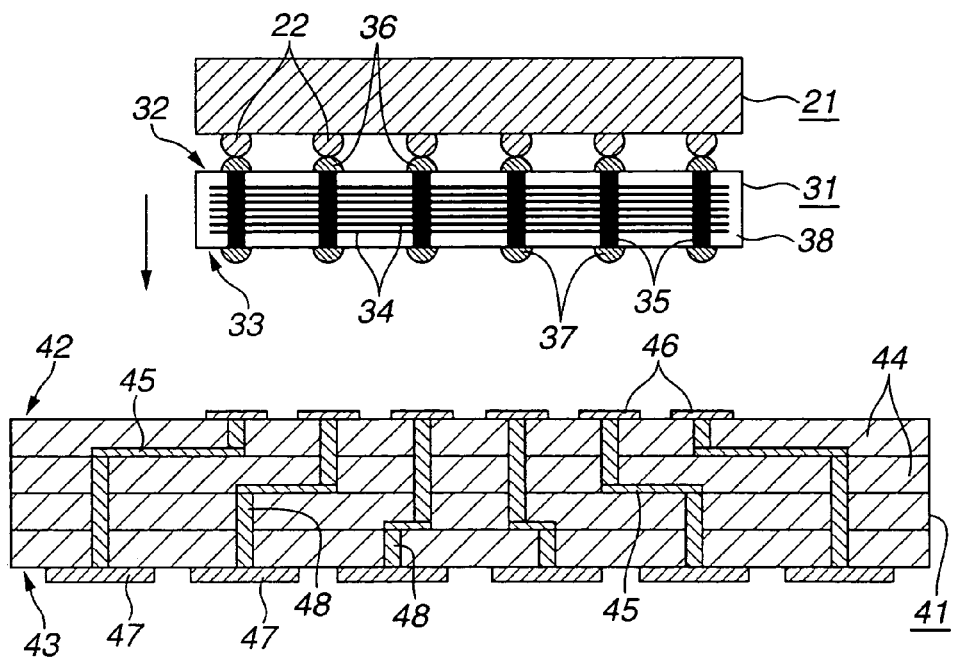
FIG. 4 is a schematic sectional view illustrating mounting of the IC chip equipped capacitor on the circuit substrate.

Then, the IC chip equipped capacitor 61 is mounted on the circuit substrate 41 in such a manner that the lower surface side bumps 37 on the capacitor 31 side and the surface-connecting pads 46 on the circuit substrate 41 side are aligned with each other (refer to FIG. 4). Thereafter, the lower surface side bumps 37 are heated to reflow and thereby joined to the respective surface-connecting pads 46. As a result, the semiconductor package 11 shown in FIG. 1 is completed.

Accordingly, the following effects can be obtained by this embodiment.

(1) In case of the semiconductor package 11 of this embodiment, the capacitor 31 itself has a function of an interposer and is placed at a position where the interposer should be disposed. Namely, as compared with the conventional structure, the IC chip 21 and the capacitor 31 are disposed closer and directly connected to each other. For this reason, the wiring (i.e., capacitor connecting wiring) connecting between the IC chip 21 and the capacitor 31 can be eliminated almost completely. Thus, the noise tending to intrude through a joining portion between the IC chip 21 and the capacitor 31 can be suppressed and reduced to a quite small value, thus making it possible to attain a semiconductor package of a high reliability and free from such a defect of an operational error caused by the noise.

(2) Further, in case the capacitor 31 is defective, it will do to throw away the capacitor 31 only since the capacitor 31 is not embedded in the circuit substrate 41 side, so that throwing away of the entire circuit substrate 41 is not necessitated. Accordingly, as compared with the convention structure in which the capacitor 31 is embedded in the circuit substrate 41, the loss of money can be decreased and therefore the semiconductor package 11 can be produced at low cost. Furthermore, since the capacitor 31 is not embedded in the circuit substrate 41 side, it is free from the restriction of space and therefore can be large-sized (i.e., increased in the capacity) relatively easily, while at the same time the circuit substrate itself can be produced with ease. Further, increase in size of the capacitor 31 leads to decrease in the resistance and inductance, thus making it possible to attain further improvement in removal of noise.

(3) In the semiconductor package 11, the capacitor main body 38 having a thermal expansion coefficient of less than 5.0 ppm/° C. and nearly in the form of a plate is used. Thus, the difference in the thermal expansion coefficient between the capacitor 31 and the IC chip 21 becomes smaller, so that it does not occur that a large thermal stress is directly applied to the IC chip 21. Accordingly, even if the IC chip 21 is large-sized so as to generate a large amount of heat, crack or cracks are hard to be caused in the IC chip 21. Thus, the semiconductor package 11 can attain a high reliability at the portions to be joined with IC chips or the like.

Modification of the first embodiment will be described.

[Modification 1]

As shown in FIG. 5, the capacitor 31 is soldered to the upper surface 42 of the circuit substrate 41 thereby preparing a capacitor equipped circuit substrate (capacitor equipped substrate assembly) 71 beforehand. Thereafter, the IC chip 21 is soldered to the upper surface 32 of the capacitor equipped circuit substrate 71 thereby forming the desired semiconductor package 11.

Second Embodiment

Figure 6:
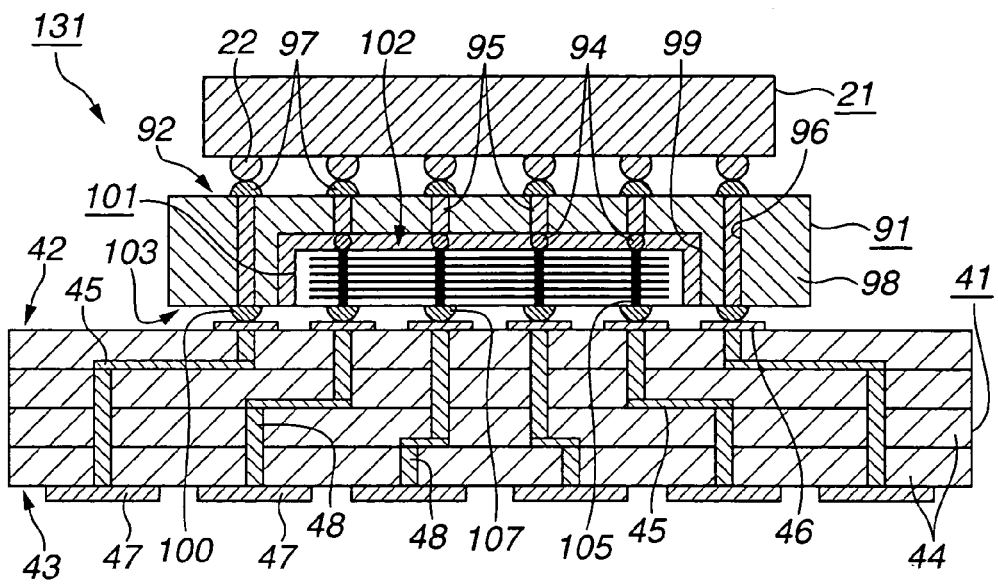
FIG. 6 is a schematic sectional view of a semiconductor package (assembly) consisting of an IC chip (semiconductor device), an interposer (interconnect substrate) with a built-in capacitor and a circuit substrate (substrate) according to a second embodiment of the present invention.

Referring to FIGS. 6 to 10, a semiconductor package (an assembly of a semiconductor device, an interposer and a substrate) according to a second embodiment of the present invention will be described. In FIG. 6, the semiconductor package is generally indicated by 131 and includes an IC chip (semiconductor device) 21, a capacitor built-in interposer (capacitor equipped interposer assembly) 91 and a circuit substrate (substrate) 41.

As shown in FIG. 6, the semiconductor package 131 of this embodiment is of the LGA (land grid array) type including, as described above, the IC chip 21, a capacitor built-in interposer 91 and the circuit substrate 41. In the meantime, the semiconductor package 131 is not limited to the LGA type but can be of another type such as BGA (ball grid array) and PGA (pin grid array). The IC chip 21 and the circuit substrate 41 are the same as those utilized in the first embodiment, so that detailed description thereto is omitted.

Figure 7:
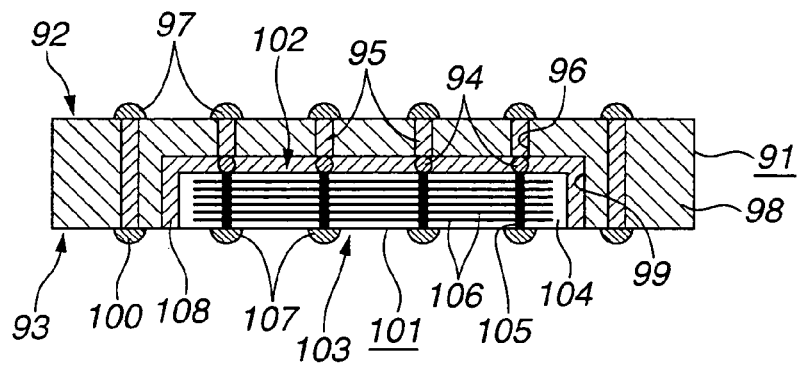
FIG. 7 is a schematic sectional view of the interposer with the built-in capacitor of FIG. 6.

As shown in FIGS. 6 and 7, the capacitor built-in interposer 91 includes an interposer main body 98 in the form of a square flat plate having an upper surface (first surface) 92 and a lower surface (second surface) 93. The interposer main body 98 includes an aluminum nitride substrate having a laminated structure. Such an aluminum nitride substrate has a thermal expansion coefficient of about 4.4 ppm/° C. and a Young's modulus of about 350 Gpa. Accordingly, the thermal expansion coefficient of the interposer main body 98 is smaller than that of the circuit substrate 41 and larger than that of the IC chip 21. Namely, it can be said that the capacitor built-in interposer 91 in this embodiment has a thermal expansion coefficient smaller than that of the circuit substrate 41 and rather close to that of the IC chip 21. Further, since the Young's modulus of the aluminum nitride substrate is higher than that of the IC chip 21, the capacitor built-in interposer 91 in this embodiment has a high rigidity.

The interposer main body 98 has at a lower surface 93 thereof a recess 99 having an open end at the lower surface. The recess 99 is nearly rectangular when observed in a plan view. Within the recess 99 is disposed a capacitor 101 having a nearly rectangular shape when observed in a plan view. In the meantime, the capacitor 101 is fixedly held within the recess 99 by means of an adhesive layer 108 made of resin. However, a modification that dispenses with the adhesive layer 108 is possible.

The interposer main body 98 constituting the capacitor built-in interposer 91 has a plurality of via holes 96 extending between the upper surface 92 and the lower surface 93 and a plurality of via holes 96 extending between the upper surface 92 and the bottom surface of the recess 99, which via holes 96 are arranged in a grid array. The via holes 96 are arranged so as to correspond in position to the respective surface-connecting pads 46 of the circuit substrate 41. Within the via holes 96 are disposed interposer side electrically conductive vias 95 made of Pb—Sn solder and each having a columnar shape. An upper end surface side bump 97 at an upper end surface of each electrically conductive via 95 protrudes from the upper surface 92 and is connected to the IC chip 21 side surface-connecting terminal 22. At the lower end surfaces of the interposer main body side electrically conductive vias 95 are provided lower end surface side bumps 94, 100 each having a nearly semispherical shape. The lower end surface side bumps 100 protrude from the lower surface 93 of the interposer main body 98 and are connected to the surface-connecting pads 46 of the circuit substrate 41. On the other hand, the lower surface side bumps 94 protrude from the bottom surface of the recess 99 and are connected to the upper end surfaces of the capacitor 101 side electrically conductive vias 105.

Further, as shown in FIGS. 6 and 7, the capacitor 101 in this embodiment is of a via array type and includes a capacitor main body 104 having an upper surface 102 and a lower surface 103 and in the form of a rectangular flat plate. The capacitor main body 104 includes a barium titanate substrate having a laminated structure. Namely, the capacitor 101 is a laminated ceramic capacitor having the main body 104 made of a high dielectric. In the meantime, while in the semiconductor package 131 in this embodiment there is provided only one capacitor 101, this is not for the purpose of limitation but a plurality of capacitors 101 may be provided.

The capacitor main body 104 constituting the capacitor 101 has a plurality of via holes that extend between the upper surface 102 and the lower surface 103 and that are arranged in a grid array. Within such via holes are respectively disposed capacitor side electrically conductive vias 105 made of Pb—Sn solder. At the lower end surfaces of the capacitor side electrically conductive vias 105 are disposed lower end surface side bumps 107 having a nearly semispherical shape. The lower end surface side bumps 107 protrude from the lower surface 93 by an amount equal to that of the lower surface side bumps 100 and are connected to the circuit substrate 41 side surface-connecting pads 46.

Further, the barium titanate substrate constituting the capacitor main body 104 has inner layer electrodes 106 in the form of layers that are stacked by way of barium titanate layers serving as dielectric layers. More specifically, the capacitor side electrically conductive vias 105 are classified into two groups, i.e., first capacitor side electrically conductive vias and second capacitor side electrically conductive vias. The inner layer electrodes 106 are classified into two groups, i.e., first inner layer electrodes and second inner layer electrodes. The first inner layer electrodes and the second inner layer electrodes are stacked alternately with predetermined intervals. The first inner layer electrodes are connected to the first capacitor side electrically conductive vias and the second inner layer electrodes are connected to the second capacitor vias.

Accordingly, in the semiconductor package 131, the circuit substrate 41 side and the IC chip 21 side are electrically connected to each other by way of the electrically conductive vias 95, 105 of the capacitor built-in interposer 91. Thus, transmission of signals between the circuit substrate 41 and the IC chip 21 is performed by way of the capacitor built-in interposer 91, and at the same time power for operating the IC chip as MPU is supplied. In this case, the signals are transmitted through the interposer side electrically conductive vias 95 extending between the upper surface 92 and the lower surface 93 of the interposer main body 98 and therefore not transmitted through the inside of the capacitor 101 but transmitted directly to and from the IC chip 21. In contrast to this, the power is supplied through the interposer main body 98 and the capacitor 101. Namely, the power is transmitted through the capacitor side electrically conductive vias 105 inside the capacitor main body 98 and through the interposer side electrically conductive vias 95 extending between the upper surface 92 of the interposer main body 98 and the bottom surface of the recess 99. Further, since the semiconductor package 131 is provided with the capacitor 101, it is adapted to remove noise otherwise superposed on the power potential and the ground potential assuredly.

Then, the method of producing the semiconductor package 131 structured as above will be described.

Firstly, by the simultaneous ceramic firing method described in the first embodiment, the capacitor 101 of a structure shown in FIG. 7 is prepared beforehand. However, since barium titanate is used as a ceramic material, the firing temperature is determined so as to meet with the condition. In addition, the interposer main body 98 is prepared as described below.

Namely, by the known ceramic green sheet forming technique, a plurality of aluminum nitride green sheets having at corresponding positions via holes (through holes) 96 that are arranged in a grid array. A part of the green sheets is formed with a rectangular opening by punching or the like. Such an opening will later be used to constitute the recess 99. The green sheets are stacked and compressed to stick together. Further, W (tungsten) paste is applied to the inner circumferential surfaces of the via holes 96. Then, the stacked body of green sheets is fired in a reducing atmosphere thereby forming the interposer main body 98 including a sintered aluminum nitride body. In the interposer main body 98, a metallic underlayer (not shown) containing tungsten as a major component is formed on the inner circumferential surface of each via hole 96. Further, the surface of the metallic underlayer is processed by electroless nickel plating and electroless gold plating. Thereafter, a high-melting point solder ball of 90% Pb-10% Sn and of 0.9 mm in diameter is installed on an upper open end portion of each via hole 96 and heated to melt. As a result, the melted high-melting point solder moves downward by gravity, thus poured into the via hole 96 and attached to the metallic underlayer on the inner circumferential surface of the via hole 96 thereby forming the interposer side electrically conductive via 95. Further, the upper end surfaces and the lower end surfaces of the interposer side electrically conductive vias 95 are bulged out by the surface tension and thereby formed into upper end side bumps 97 and the lower end side bumps 94, 100.

As a result, the interposer main body 98 having the recess 99 is completed.

To the inner surface of the recess 99 of the interposer main body 98 is applied an uncured thermosetting adhesive. Under this condition, the capacitor 101 is disposed within the recess 99 and heated together with the interposer main body 98 at a predetermined temperature. As a result, by way of the lower end surface side bumps 94 that are reflowed by heating, the interposer main body side electrically conductive vias 95 and the capacitor side electrically conductive vias 105 are joined together. Further, by curing of the thermosetting adhesive, the capacitor 101 is adhered to the recess 99 and held inside of the same assuredly. As a result, the capacitor built-in interposer 91 shown in FIG. 7 is completed.

Figure 8:
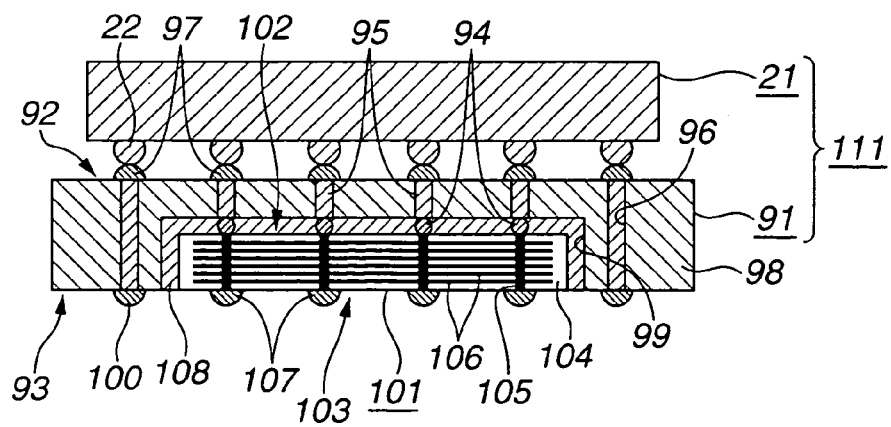
FIG. 8 is a schematic sectional view of the interposer with the built-in IC chip equipped capacitor (semiconductor device equipped interposer) constituting the semiconductor package of FIG. 6.

Then, on the upper surface 92 of the capacitor built-in interposer 91 is mounted the IC chip 21. At this time, the surface-connecting terminals 22 of the IC chip 21 and the upper end surface side bumps 97 on the capacitor built-in interposer 91 side are aligned with each other. Then, heating is carried out to reflow the upper end surface side bumps 97 thereby joining the upper end surface side bumps 97 and the surface-connecting terminals 22 together. As a result, an IC chip equipped capacitor built-in interposer (semiconductor device equipped interposer assembly) 111 as shown in FIG. 8 is completed.

Figure 9:
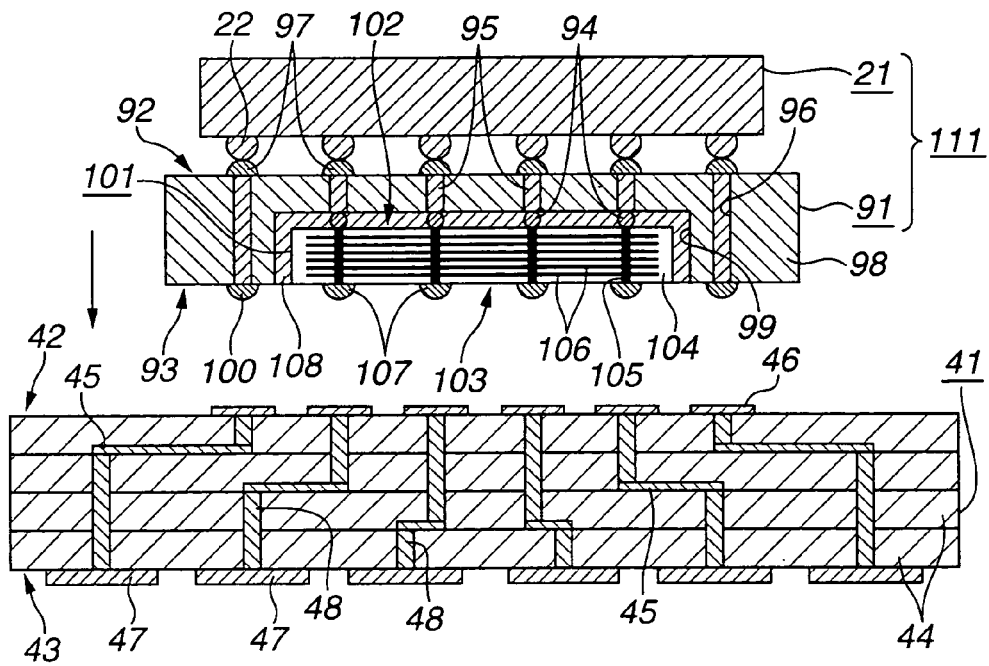
FIG. 9 is a schematic sectional view illustrating mounting of the interposer with the built-in IC chip equipped capacitor on the circuit substrate.

Then, the IC chip equipped capacitor built-in interposer 111 is mounted on the circuit substrate 41 while aligning the lower end surface side bumps 100, 107 on the IC chip equipped capacitor built-in interposer 111 side with the surface-connecting pads 46 on the circuit substrate 41 side (refer to FIG. 9). Then, heating is carried out to reflow the lower end surface side bumps 100, 107 thereby joining the lower end surface side bumps 100, 107 and the surface-connecting pads 46 together. As a result, the semiconductor package 131 shown in FIG. 6 is completed.

Accordingly, this embodiment can attain the following effects.

(1) In case of the semiconductor package 131 of this embodiment, the capacitor 101 is disposed inside the recess 99 of the interposer 91 such that the IC chip 21 and the capacitor 101 come closer as compared with the conventional structure. As a result, the wiring (capacitor connecting wiring) connecting between the IC chip 21 and the capacitor 101 can be considerably shorter. Accordingly, noise intruding through a joining portion between the IC chip 21 and the capacitor 101 can be suppressed so as to be reduced considerably, thus making it possible to attain a high reliability in operation without causing any defect such as an erroneous operation.

(2) Further, if the capacitor 101 is defective, it will do to throw away the capacitor 101 only since the capacitor 101 is not embedded in the circuit substrate 41 side, so that throwing away of the entire circuit substrate 41 is not necessitated. Accordingly, as compared with the convention structure in which the capacitor 101 is embedded in the circuit substrate 41, the loss of money can be decreased and therefore the semiconductor package 131 can be produced at low cost. Furthermore, since the capacitor 101 is not embedded in the circuit substrate 41 side, it is free from the restriction of space and therefore can be large-sized (i.e., increased in the capacity) relatively easily, while at the same time the circuit substrate itself can be produced with ease. Further, increase in size of the capacitor 101 contributes to decrease in the resistance and inductance, thus making it possible to attain further improvement in removal of noise.

(3) In the semiconductor package 131, the interposer main body 98 having a thermal expansion coefficient of less than 5.0 ppm/° C. and nearly in the form of a plate is used. Thus, the difference in the thermal expansion coefficient between the interposer main body 98 and the IC chip 21 becomes smaller, so that it does not occur that a large thermal stress is directly applied to the IC chip 21. Accordingly, even if the IC chip 21 is large-sized so as to generate a large amount of heat, crack or cracks are hard to be caused in the IC chip 21. Thus, the semiconductor package 131 can attain a large reliability at the portions to be joined with IC chips or the like.

Modifications of the second embodiment will be described.

[Modification 2-1]

Figure 10:
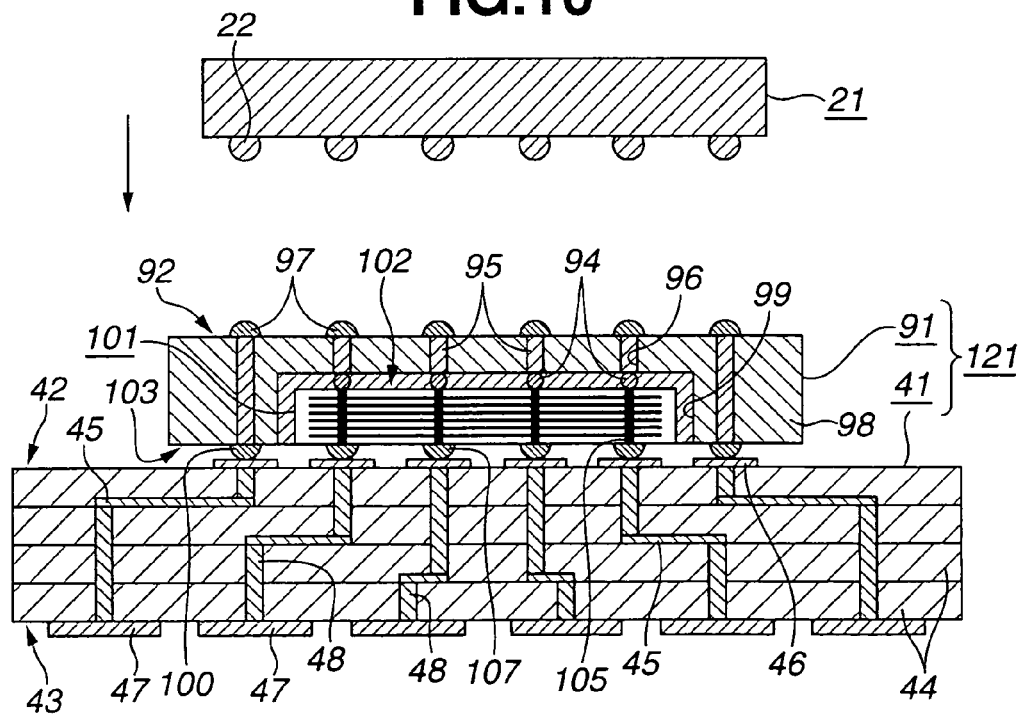
FIG. 10 is a schematic sectional view illustrating mounting of the IC chip on the circuit substrate with the interposer having the built-in capacitor (interposer equipped substrate) according to a modification of the second embodiment.

As shown in FIG. 10, the capacitor built-in interposer 91 is soldered to the upper surface 42 of the circuit substrate 41 thereby preparing a capacitor built-in interposer equipped circuit substrate (interposer equipped substrate assembly) 121 beforehand. Thereafter, the IC chip 21 is soldered to the upper surface 92 of the capacitor built-in interposer 91 thereby forming the desired semiconductor package 131.

[Modification 2-2]

In the capacitor built-in interposer 91 shown in FIG. 6, the interposer main body 98 and the capacitor 101 are structured so as to be separate from each other and joined together by way of the adhesive layer 108 and the lower end surface side bumps 94. In contrast to this, in a capacitor built-in interposer 141 shown in FIGS. 11 and 12 according to a modification of the present invention, the interposer main body 98 and the capacitor 101 are structure so as to be integral with each other. Namely, the interposer main body 98 and the capacitor 101 are directly connected without interposing therebetween the adhesive layer 108 and the lower end surface bumps 94. In this case, the end surface side bumps 94 for electrically connecting the interposer main body 98 and the capacitor 101 can be dispensed with, thus making it possible to simplify the structure of the semiconductor package 131. Further, by connecting the interposer main body side electrically conductive vias 95 and the capacitor side electrically conductive vias 105 directly to each other, the resistance of the capacitor built-in interposer 141 can be made smaller.

Then, the method of producing the capacitor built-in interposer 141 will be described. Firstly, by the known ceramic green sheet forming technique, a plurality of alumina green sheets (unsintered ceramic body) having at corresponding positions thereof via holes (through holes or first electrically conductive via forming holes) 96 arranged in a grid array. A part of the green sheets is formed with a rectangular opening by punching or the like. Such an opening will later be used to constitute the recess 99. The green sheets are formed into the interposer main body 98 after sintering. In the meantime, within the through holes of the green sheets are filled beforehand paste (electrically conductive material) such as nickel by printing for instance. Masses of nickel paste within the through holes are later formed into the interposer side electrically conductive vias 95 and the capacitor side electrically conductive vias 105.

A predetermined number of green sheets having been filled with the above-described electrically conductive material are stacked to form a stacked green sheet body. Then, each time one green sheet having the rectangular opening is stacked on the stacked green sheet body, a pattern of ceramic paste layer is formed in the rectangular opening by screen printing. The thickness of the thus printed ceramic paste layer after dried is nearly the same as that of the green sheet having been stacked immediately before the printing. The ceramic material to be screen printed later constitutes dielectric layers. Accordingly, such a ceramic material that becomes higher in the dielectric constant than alumina after sintering should be selected. In this embodiment, a slurry that becomes a barium titanate after sintering is used as the above-described ceramic material. In the meantime, the ceramic material is preferably of the kind that can be sintered together with the green sheets. Then, by printing of nickel paste (electrically conductive material), a pattern of a nickel paste layer is formed on the ceramic material layer having already been printed. At this time, nickel paste printed in hole portions where the ceramic layer is not formed are later used to constitute the electrically conductive vias 105 at the capacitor portion. The nickel paste layer on the surface of the printed ceramic layer is later formed into the inner layer electrode 106.

Then, by the repetition of stacking and sticking by pressing of each green sheet, printing of ceramic paste and printing of nickel paste, a stacked body is formed and thereafter sintered in an oxidizing atmosphere. Namely, the green sheets (unsintered ceramic body), unsintered ceramic material layers and unsintered nickel paste are heated altogether and sintered simultaneously.

Figure 11:
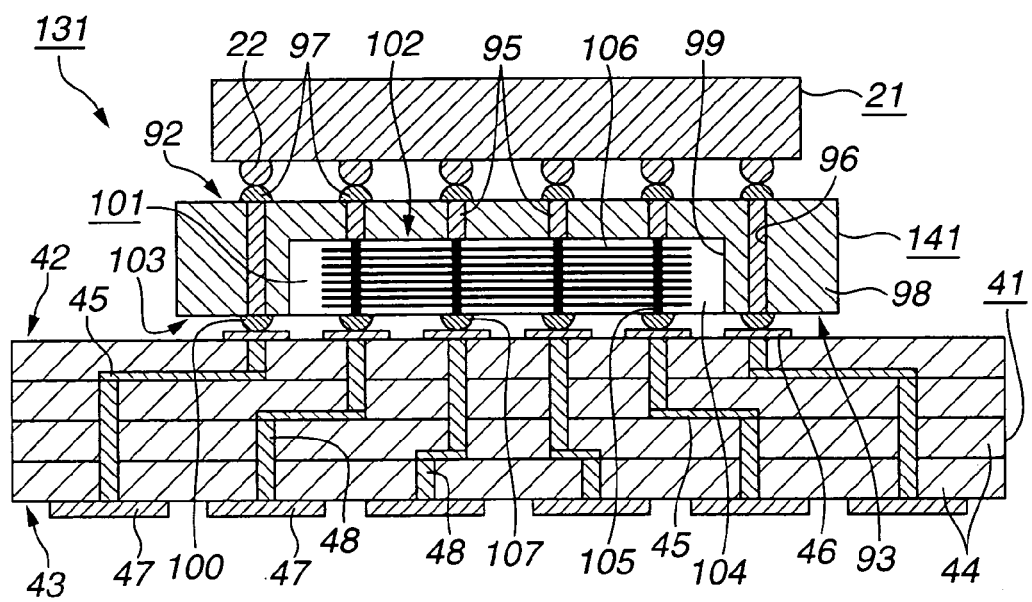
FIG. 11 is a schematic sectional view of a semiconductor package (assembly) consisting of an IC chip (semiconductor device), an interposer with a built-in capacitor and a circuit substrate (substrate) according to another modification of the second embodiment.
Figure 12:
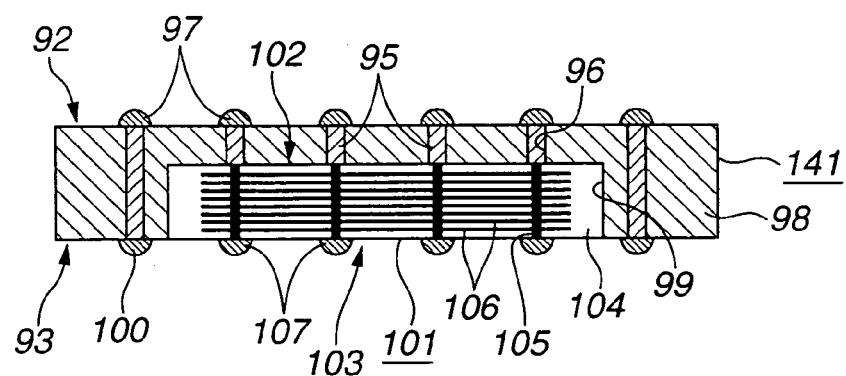
FIG. 12 is a schematic sectional view of the interposer with the built-in capacitor of FIG. 11.

Thus, by the production method, the capacitor built-in interposer 141 shown in FIGS. 11 and 12 can be obtained assuredly.

Third Embodiment

Figure 13:
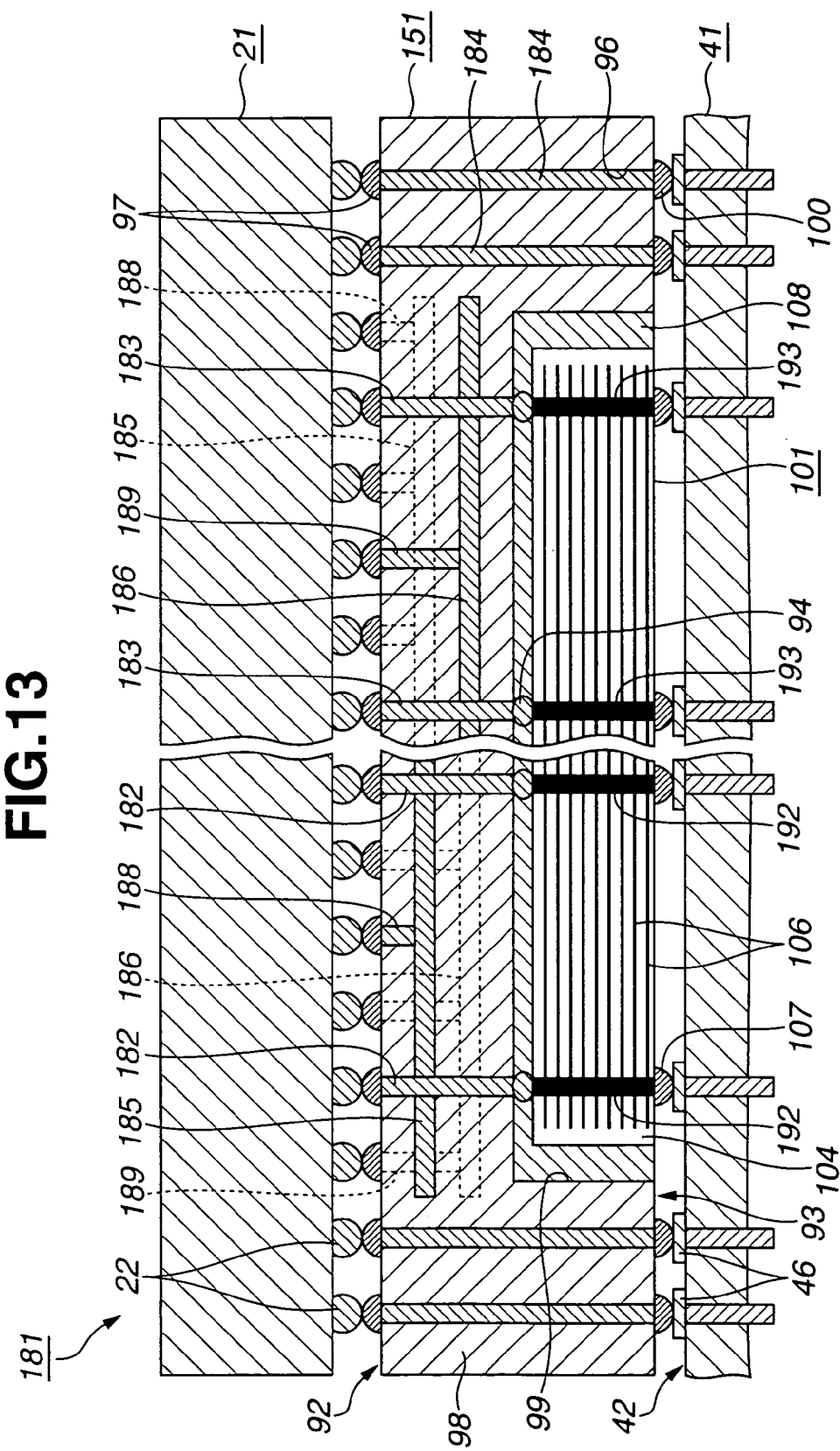
FIG. 13 is a semiconductor package (assembly) consisting of an IC chip (semiconductor device), an interposer with a built-in capacitor and a circuit substrate (substrate) according to a further modification of the second embodiment.

Referring to FIG. 13, a semiconductor package (an assembly of a semiconductor device, an interposer and a substrate) according to a third embodiment of the present invention is generally indicated by 181 and includes an IC chip (semiconductor device) 21, capacitor built-in interposer 151 and a circuit substrate (substrate) 41.

The capacitor built-in interposer 151 in this embodiment includes a plurality of interposer side electrically conductive ground vias 182 and a plurality of interposer side electrically conductive power vias 183. Both of the two kinds of interposer side electrically conductive vias 182, 183 are disposed within a recess forming area of the interposer main body 98. Within the recess forming area are similarly disposed a plurality of short electrically conductive ground vias 188 and a plurality of short electrically conductive power vias 189. On the other hand, a plurality of interposer main body side electrically conductive vias 184 for signal lines are disposed outside of the recess forming area of the interposer main body 98 (i.e., at a portion surrounding the recess 99) so as to surround the above-described two kinds of interposer main body side electrically conductive vias 182, 183. In the meantime, the interposer main body side electrically conductive vias 182, 183 are arranged at a pitch equal to that of the surface-connecting terminals of the IC chip 21 and set at a value ranging from about 100 μm to 250 μm.

Further, the capacitor built-in interposer of this embodiment has within the capacitor 101 a plurality of capacitor side electrically conductive ground vias 192 and a plurality of capacitor side electrically conductive vias 193. The pitch of the two kinds of capacitor side electrically conductive vias 192, 193 is several times larger than that of the surface-connecting terminals 22 of the IC chip 21 and is set, in this embodiment, at a value ranging from about 200 μm to about 600 μm. Namely, the capacitor side electrically conductive vias 192, 193 are arranged relatively not so densely but coarsely, i.e., in such a manner that some of them removed.

Within the interposer main body 98 is formed a electrically conductive via pitch changing layer 185 by printing and sintering of tungsten. A plurality of short electrically conductive ground vias 188 are connected at the lower ends thereof to the electrically conductive via pitch changing layer 185 but not extended so as to reach the bottom of the recess 99. Further, a plurality of interposer side electrically conductive ground vias 182 are not only connected to the electrically conductive via pitch changing layer 185 but also extended through the electrically conductive via pitch changing layer 185 to reach at the lower ends thereof the bottom of the recess 99. The lower ends of the interposer side electrically conductive ground vias 182 penetrating the electrically conductive via pitch changing layer 185 are connected to the capacitor side electrically conductive ground vias 192 by way of the bumps 94. As a result, the plurality of interposer side electrically conductive ground vias 182, the plurality of short electrically conductive ground vias 188 and the plurality of capacitor side electrically conductive ground vias 192 are electrically connected to each other by way of the electrically conductive via pitch changing layer 185.

Further, within the interposer main body 98 is formed another electrically conductive via pitch changing layer 186. The electrically conductive via pitch changing layer 186 is also formed from tungsten past by printing and sintering. In the meantime, the two electrically conductive via pitch changing layers 185, 186 are disposed at positions different in depth. The plurality of short electrically conductive power vias 189 are connected at the lower ends thereof to the electrically conductive via pitch changing layer 186 but not extended to reach the bottom of the recess 99. The interposer main body side electrically conductive power vias 183 are not only connected to the electrically conductive via pitch changing layer 186 but also extended through the electrically conductive via pitch changing layer 186 so as to have lower ends reaching the bottom surface of the recess 99. The lower ends of the interposer main body side electrically conductive power vias 183 extended through the electrically conductive via pitch changing layer 186 are connected to capacitor side electrically conductive power vias 193. As a result, the plurality of interposer main body side electrically conductive power vias 183, the plurality of short electrically conductive power vias 189 and the plurality of capacitor side electrically conductive power vias 193 are electrically connected to each other by way of the electrically conductive via pitch changing layer 186.

This embodiment having the above-described structure can basically increase the freedom of arrangement of the capacitor side electrically conductive ground vias 192 and the capacitor side electrically conductive power vias 193. Accordingly, it becomes possible to attain desired capacitance and inductance characteristics and therefore provide the capacitor built-in interposer 151 with a desired operational ability. Further, with the structure of this embodiment, it becomes possible to remove some of the capacitor side electrically conductive ground vias 192 and the capacitor side electrically conductive power vias 193.

Fourth Embodiment

Figure 15:
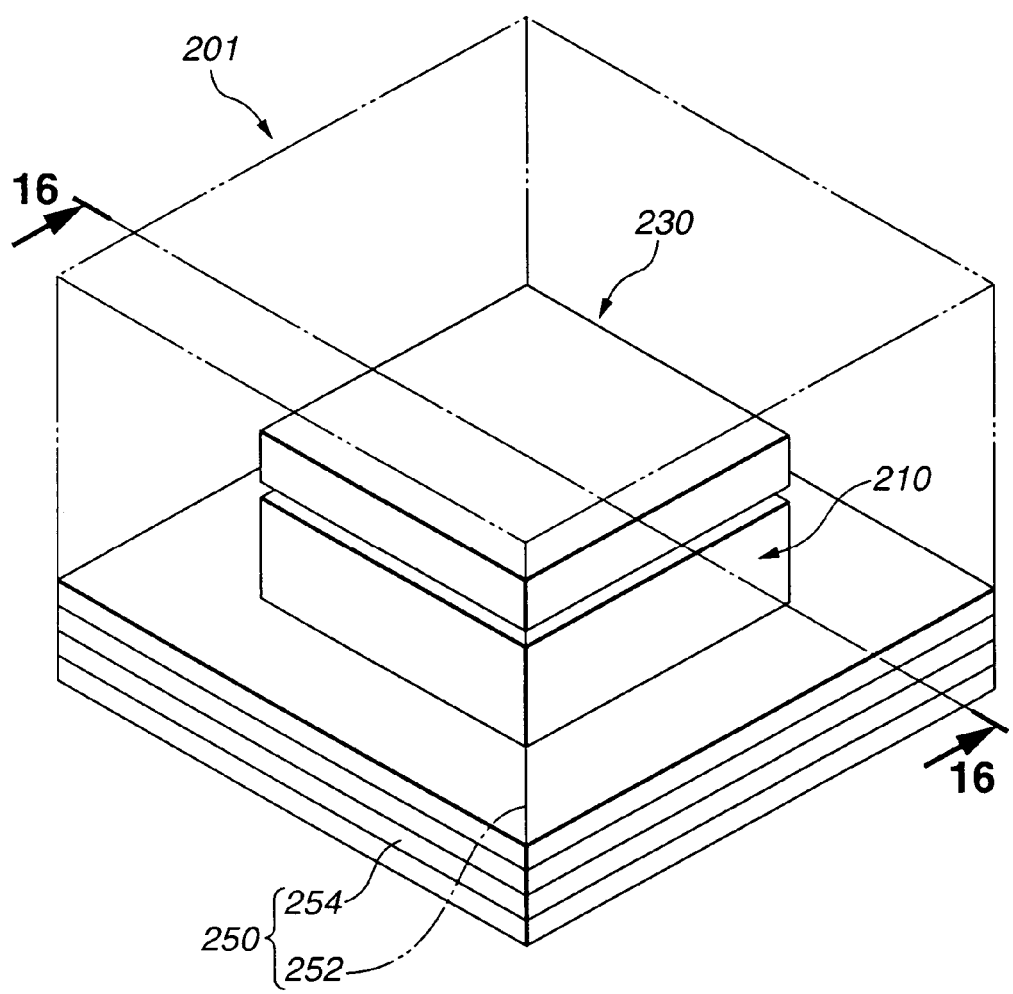
FIG. 15 is a schematic perspective view of a semiconductor package (assembly) including an interposer according to a fourth embodiment of the present invention.
Figure 16:
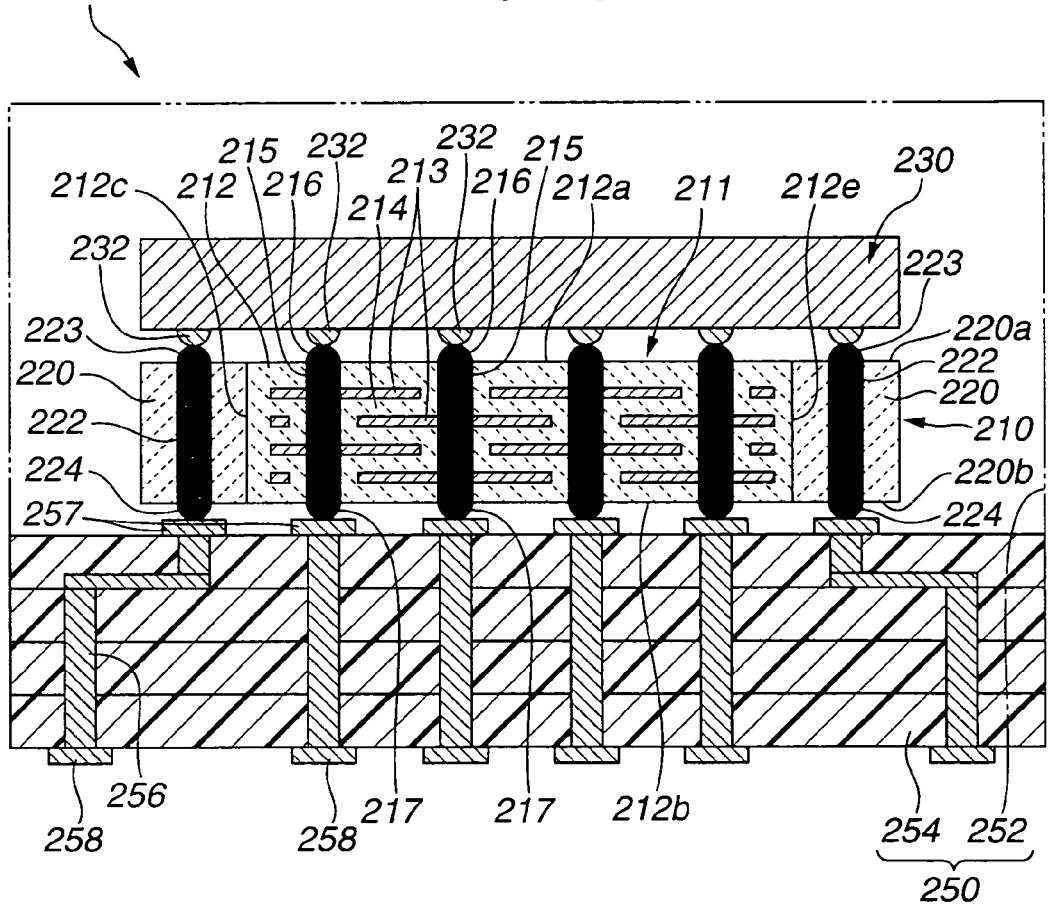
FIG. 16 is a sectional view taken along the line 16-16 in FIG. 15.
Figure 17:
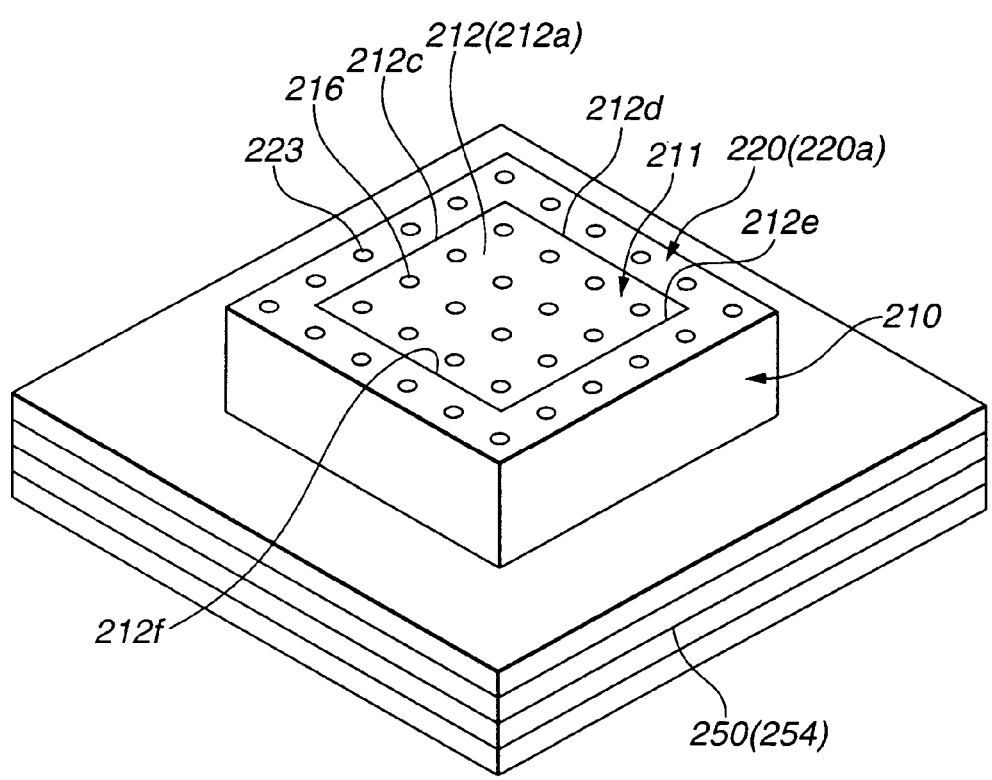
FIG. 17 is a view similar to FIG. 15 but shows the semiconductor package in a state prior to mounting of an IC chip on a package.

Referring to FIGS. 15 to 17, a semiconductor package (an assembly of a semiconductor device, an interposer and a substrate) according to a fourth embodiment of the present invention is generally indicated by 201 includes an IC chip (semiconductor device) 230 that is a small piece made up of a silicon substrate (wafer) on which a number of circuit elements such as transistors and resistors are formed. Between such circuit elements are connected by a number of aluminum wires. The aluminum wires connected to the circuit elements are extended to the lower side surface of the IC chip 230 and connected to bump-shaped pads 232. A number of pads 232 are arranged in a grid array on the lower side surface of the IC chip 230 so as to correspond in position to end portions of the aluminum wires located at the lower side surface of the IC chip 230.

A package 250 is a receptacle for encasing therewithin an interposer 210 equipped with the IC chip 230 and includes a lower layer 254 that constitutes an insulation layer on which the interposer 210 is disposed. In this embodiment, the lower layer 254 is made of an epoxy resin. Of course, the lower layer 254 may be made of another insulating material such as a resin material other than epoxy and a ceramic material. In the meantime, in addition to such lower layer 254, an upper layer 252 that serves as an insulation layer covering the IC chip 230 and the interposer 210 may be employed as indicated by two-dot chain lines in FIGS. 15 and 16. By this, the IC chip 230 and the interposer 210 can be embedded or enclosed in the insulation layers so as to protect the IC chip 230 and the interposer 210 effectively from the outside.

The lower layer 254 is formed by stacking a number of rectangular sheets or plate-shaped bodies made of epoxy resin. An electrical conduction or connection between adjacent layer sections of the lower layer 254 is provided by electrically conductive leads or vias 256 made of copper plating layers or copper films. Each electrically conductive via 256 has a first terminal 257 exposed at the upper surface (upper surface in FIG. 16) of the lower layer 254 and a second terminal 258 exposed at the lower surface (lower surface in FIG. 16) of the lower layer 254. The first terminal 257 is a terminal for connection to the interposer 210 and a number of first terminals 257 are arranged in a grid array on the upper surface of the lower layer 254. Further, the second terminal 258 is soldered to a printed circuit substrate side terminal when the assembled IC package 260 is installed on a printed circuit board (not shown) such as a motherboard.

A main body of the interposer 210 is made up of a capacitor portion 211 and a surrounding portion 220. The capacitor portion 211 is a region where a stacked ceramic capacitor 212 is disposed. At the upper surface and lower surface of the capacitor portion 211 are directly exposed the supper surface 212a and the lower surface 212b of the stacked ceramic capacitor 212.

The stacked ceramic capacitor 212 includes a ceramic layer 214 interposed between inner layer electrodes 213 that serve as terminal plates. A number of such ceramic layers and inner layer electrodes 213 are stacked alternately so as to constitute a stacked structure (multi-layer structure) For this reason, each ceramic layer 214 is held between two inner layer electrodes 213. In the meantime, in this embodiment, as a material for forming the ceramic layers 214 is used barium titanate (BaTiO3) that is relatively high in specific inductive capacity and thermal expansion coefficient (12 to 13 ppm/° C.).

The inner layer electrodes 213 on every other layers are electrically connected to a via electrode 215. The via electrodes 215 are formed so as to penetrate the stacked ceramic capacitor 212 between the upper surface 212a and the lower surface 212b. A number of such via electrodes 215 are provided with predetermined intervals.

By stacking the inner layer electrodes 213 alternately and connecting the inner layer electrodes 213 to the via electrodes 215 in the manner as described above, the stacked ceramic capacitor 212 is formed. In such a stacked ceramic capacitor 212 of a multi-layer structure, a number of portions where a charge is stored can be formed in a stacked manner, so that a large electrostatic capacity can be attained by a capacitor of a relatively small size.

As shown in FIG. 17, the surrounding portion 220 is formed so as to surround all the lateral periphery of the capacitor body 211. More specifically, the surrounding portion 220 is formed so as to surround all of four side surfaces 212c to 212f of the multilayered ceramic capacitor 212. The upper surface 220a and the lower surface 220b of the surrounding portion 220 and the upper and lower surfaces of the capacitor portion 211 are located nearly on the same respective planar surfaces. The surrounding portion 220 is made of alumina that is a material lower in specific inductive capacity and thermal expansion coefficient (about 8 ppm/° C.) than a material (barium titanate) forming the ceramic layers 214. The formed surrounding portion 220 has a relatively high Young's modulus of 300 GPa or more.

Within the surrounding portion 220 are formed columnar electrodes 222 that penetrate therethrough from the upper surface 220a to the lower surface 220b. In the meantime, the surrounding portion 220 is not formed with barium titanate layers such as ceramic layers 214. Thus, the columnar electrodes 222 are not in contact with the barium titanate layers.

In the meantime, in this embodiment, as a material for forming the inner layer electrodes 213, via electrodes 215 and the columnar electrodes 222 is used nickel. In this embodiment, the inner layer electrodes 213, via electrodes 215 and the columnar electrodes 222 constitute a wiring or wires for electrically connecting the IC chip 230 and the package 250 with each other.

As shown in FIG. 17, at the upper surfaces 212a, 220a are disposed the upper ends of the via electrodes 215 and the columnar electrodes 222 in a similar grid array similar to the pads 232 of the IC chip 230. At the respective upper ends of the via electrodes 215 and the columnar electrodes 222 are formed, as shown in FIG. 16, solder bumps 216, 223 bulging out from the upper surfaces 212a, 220a and having a nearly semispherical shape. Further, at the lower surfaces 212b, 220b are arranged lower ends of the via electrodes 215 and the columnar electrodes 222 in a similar grid array to the first terminal electrodes 257 of the package 250. At the respective lower ends of the via electrodes 215 and the columnar electrodes 222 are formed, as shown in FIG. 16, solder bumps 217, 224 bulging out from the lower surface 212b and having a nearly semispherical shape.

As described above, the surrounding portion 220 is formed in the region of surrounding the capacitor portion 211. For this reason, the columnar electrodes 222 and the bumps 223, 224 are formed in the outside region outside the interposer 210 (i.e., the region adjacent the outer side surface), whereas the via electrodes 215 and the bumps 216, 217 are disposed in the region inside the above-described outside region (refer to FIG. 17).

In this embodiment, a number of via electrodes 215 provided to the capacitor portion 211 are used as wires for supplying power (voltage) to the IC chip 230. Namely, of the via electrodes 215, those connected to the inner layer electrodes 213 that serve as positive poles are used as power wires for the IC chip 230 and those connected to the inner layer electrodes 213 that serve as negative poles are used as ground wires for the IC chip 230. In the IC chip 230 supplied with power in the above-described manner, various kinds of processing DM (e.g., transmission of data and flow control) is executed. The number of columnar electrodes 222 provided to the surrounding portion 220 are used as wires for transmitting electrical signals representative of the above described processing DM.

Figure 18:
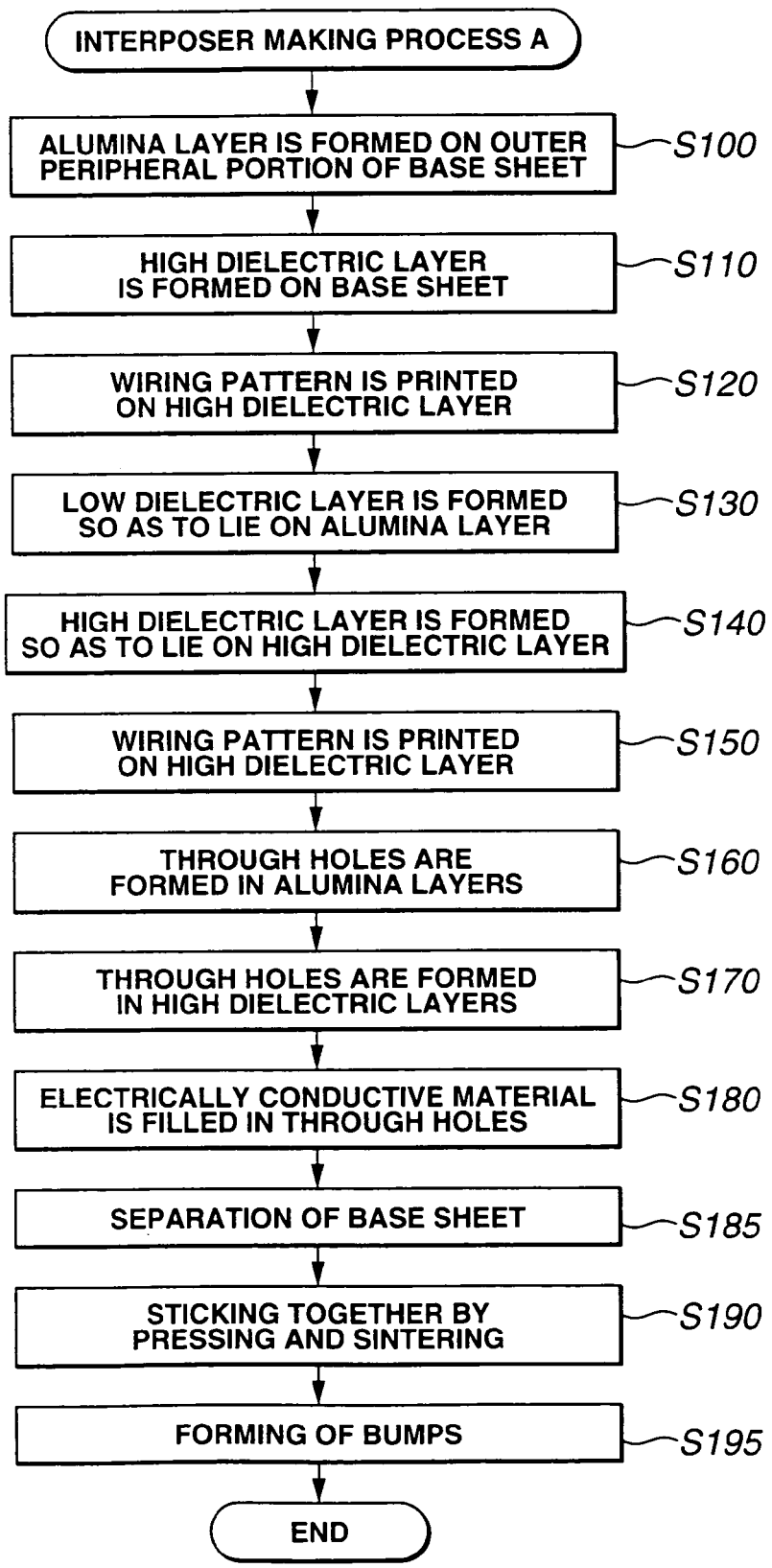
FIG. 18 is a flowchart of a method of producing an interposer for use in the semiconductor package of FIG. 15.

The interposer 210 is produced by a production process "A" including process steps S100 to S195 shown in FIG. 18. The process steps will be described with additional reference to FIGS. 19A to 19E which show the process of making the interposer 210.

Firstly, a base sheet 289 made of alumina is prepared. On a peripheral portion of the base sheet 289 is formed an alumina layer 280a made of alumina (S100, FIG. 19A). Then, in the region on the base sheet 289 where the alumina layer 280a is not formed is formed a high dielectric layer 274a made of barium titanate and having a specific inductive capacity of 2000 or larger, and on the high dielectric layer 274a is printed a wiring pattern 273a (S110, S120, FIG. 19B).

Then, an alumina layer 280b is formed on the alumina layer 280a so as to lie one above the other (S130), and on the high dielectric layer 274b is printed a wiring pattern 273b (S140, S150). By repeating such steps several times, alumina layers 280a to 280e are stacked on the peripheral region of the base sheet 289, whereas on the region inside the peripheral region of the base sheet 289 are stacked a high dielectric layer 274a, a wiring pattern 273a, a high dielectric layer 274b, a wiring pattern 273b, a high dielectric layer 274c, a wiring pattern 273c, a high dielectric layer 274d, a wiring pattern 273d and a high dielectric layer 273e in this order (hereinafter, a stacked body in which high dielectric layers and wiring patterns are stacked alternately will be referred to as stacked body CS). In the meantime, the thickness of each of the alumina layers 280a to 280e and the thickness of each of the high dielectric layers 274a to 274e are determined so that in the interposer 210 after a firing step which will be described later the upper surface 220a and the lower surface 220b of the surrounding portion 220 and the upper surface and the lower surface of the capacitor portion 211 (i.e., the upper surface 212a and the lower surface 212b of the multilayered ceramic capacitor 212) are approximately positioned on the same planes, respectively.

Figure 19A:
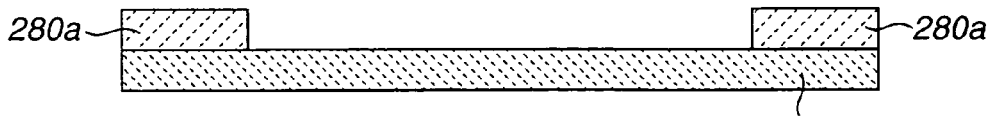
FIGS. 19A to 19E are schematic sectional views illustrating the method of FIG. 18.
Figure 19B:
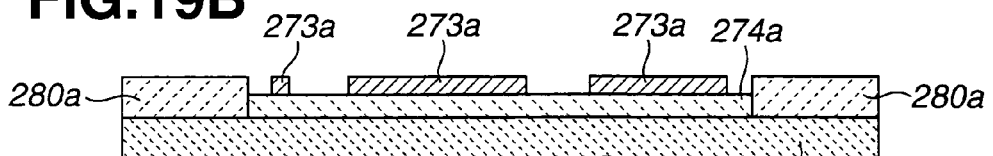
Figure 19C:
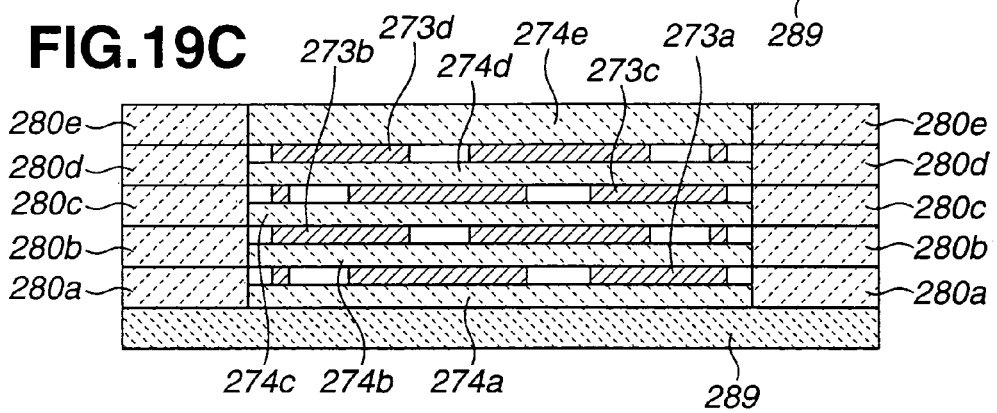
Figure 19D:
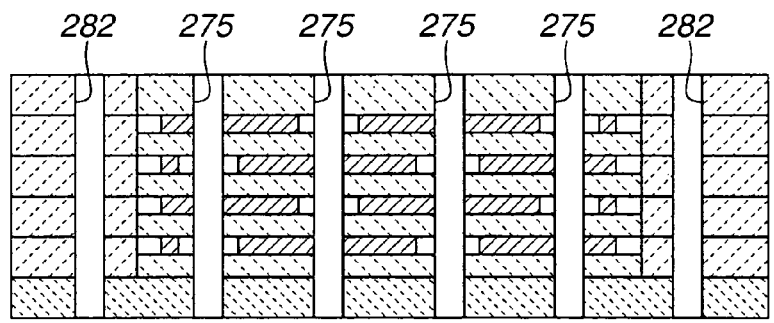

Then, through holes 282 are formed in the stacked alumina layers 280a to 280e and through holes 275 are formed in the stacked body CS (S160, S170, FIG. 19D). The through holes 282 and 275 are formed so as to correspond in position to the respective pads 232 arranged on the IC chip 230. Such through holes 282, 275 can be realized by using laser beam.

Figure 19E:
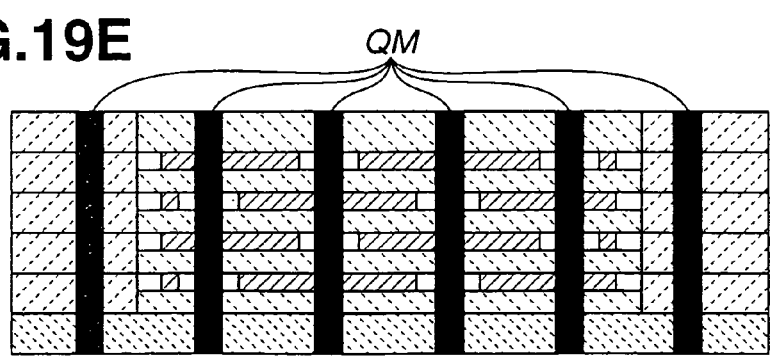

Then, in the through holes 282, 275 is filled a conductive material QM (i.e., nickel in this embodiment) (S180, FIG. 19E). By this, the columnar electrodes 222 and the via electrodes 215 are formed. Further, the wiring patterns 273a, 273c or 273b, 273d on every other high dielectric layers 274a to 274e are connected to the via electrodes 215 in the through holes 275. Such wiring patterns 273a, 273b and the high dielectric layers 274a to 274e function as the inner layer electrodes 213 and the ceramic layers 214, respectively.

Then, the base sheet 289 is separated from the alumina layers 280a to 280e and the stacked body CS (S185).

Thereafter, the alumina layers 280a to 280e and the stacked body CS are caused to stick together by high temperature-high pressure pressing. Then, the alumina layers 280a to 280e and the stacked body CS having been stuck together are subjected to degreasing and sintering (S190). By this, the alumina layers 280a to 280e and the stacked body CS are sintered so as to fittingly contact with each other while allowing the high dielectric layers 274a to 274e to fittingly contact with each other.

Then, at the upper and lower end portions of the columnar electrodes 222 and the via electrodes 215 are formed bumps 223, 224 and bumps 216, 217 by surface-printing of solder paste. By this, the interposer 210 having around the capacitor portion 211 the surrounding portion 220 made of alumina is completed.

In the meantime, while in the above-described production process "A", the through holes 282 of the alumina layers 280a to 280e are formed and filled with the electrically conductive material QM after stacking of the alumina layers 280a to 280e, the alumina layers 280a to 280e may be formed with the through holes and filled with the electrically conductive material one by one. Further, while in the above-described production process "A" the sintering is performed after the base sheet 289 is separated from the alumina layers 280a to 280e and the stacked body CS, the base sheet 289 may be sintered together with the alumina layers 280a to 280e and the stacked body CS and separated therefrom by shaving or cutting after sintering.

Figure 20:
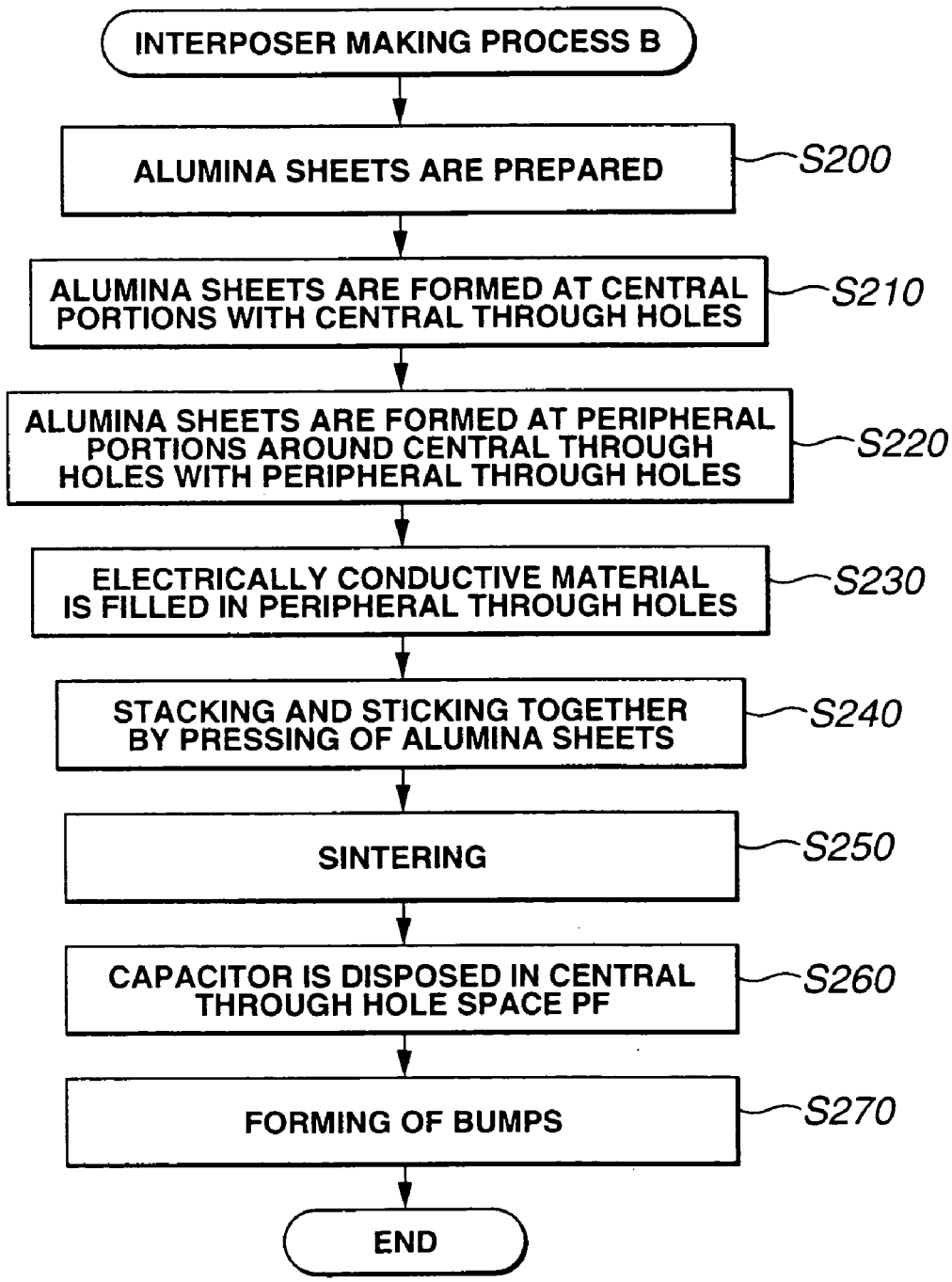
FIG. 20 is a flowchart of another method of producing the interposer for use in the semiconductor package of FIG. 15.

The interposer 210 may be produced by a process other than the above-described production process "A", i.e., a production process "B" shown in FIG. 20. The process steps will be described with additional reference to FIGS. 21A to 21D which show the process of making the interposer 210.

Figure 21A:
FIGS. 21A to 21D are schematic sectional views illustrating the method of FIG. 20.
Figure 21B:
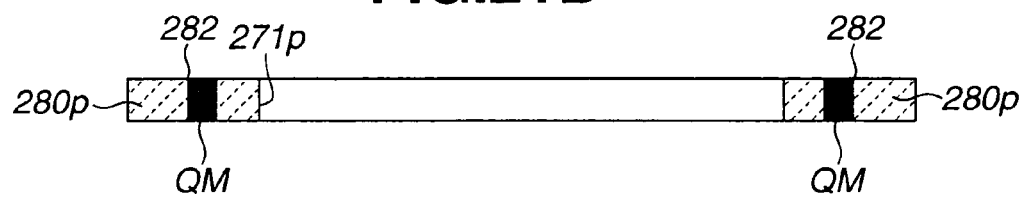

Firstly, a necessary number of sheets 280p made of alumina are prepared, and each sheet 280p is formed at a central portion thereof with a through hole 271p of a predetermined opening area (S200, S210, FIG. 21A). Then, each sheet 280p is formed at a peripheral portion around the through hole 271p with through holes 282, and thereafter an electrically conductive material QM is filled in the through holes 282 (S220, S230, FIG. 21B).

Figure 21C:
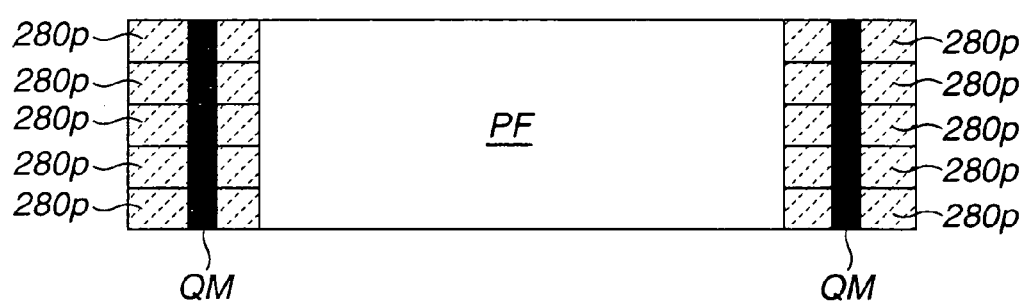

Then, the sheets 280p are stacked and stuck together by high temperature-high pressure pressing (S240, FIG. 21C). By this, as shown in FIG. 21C, masses of the electrically conductive material QM with the through holes 282 of the sheets 280p are joined together to extend continuously between the upper and lower sheets 280p thereby forming the columnar electrodes 222. Further, by the through holes 271p of the stacked sheets 280p is formed a space PF for disposition of a capacitor.

Then, the sheets 280p joined together by pressing are subjected to degreasing and thereafter sintered (S250). By this, a substrate main body including a surrounding portion 220 made of alumina having the space PF at the central portion is formed. In the space PF of the substrate main body is formed the capacitor portion 211.

Figure 21D:
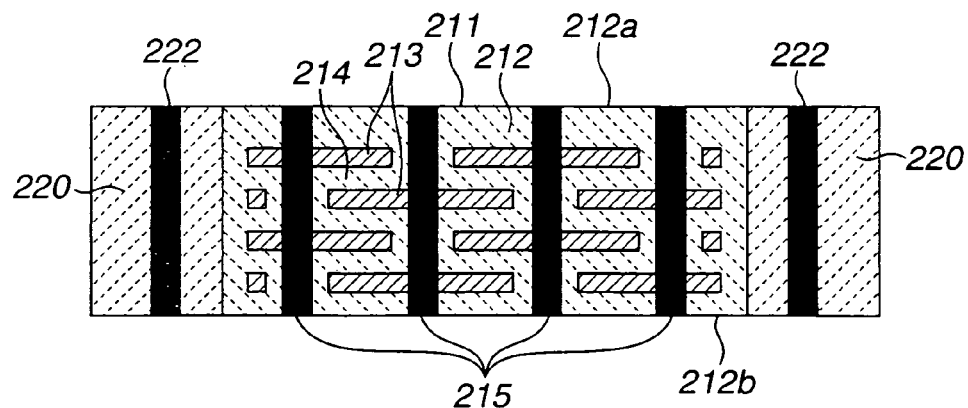

Then, in the space PF of the substrate main body is disposed the stacked ceramic capacitor 212 that is prepared separately (S260, FIG. 21D). In the meantime, the shape of the space PF of the substrate main body is determined depending upon the shape of the capacitor 212 so as to become nearly equal to the outer shape of the capacitor 212 after sintering. Thus, as shown in FIG. 21D, when the capacitor 212 is disposed in the space PF, the capacitor 212 is fittingly engaged with the inner peripheral wall of the surrounding portion 220 that defines the space PF, without substantially any space therebetween, while allowing the upper surface 212a and the lower surface 212b of the capacitor 212 and the upper surface 220a and the lower surface 220b of the surrounding portion 220 to be positioned approximately on the same planes, respectively. By this, the surrounding portion 220 and the multilayered ceramic capacitor 212 are joined together.

Then, at the upper and lower end portions of the columnar electrodes 222 and the via electrodes 215 are formed bumps 223, 224 and bumps 216, 217 by surface-printing of solder paste (S270). By this, an interposer 210 having the surrounding portion 220 made of alumina around the capacitor 211 as shown in FIG. 16 is completed.

While in the production process "B" the sheets 280p are formed with the through holes 282 and the through holes 282 are filled with the electrically conductive material one by one separately, such can be done altogether after the sheets 280p are stacked together. Further, within the space PF of the substrate main body may be disposed a capacitor other than the multilayered ceramic capacitor (e.g., a monolithic ceramic capacitor, film capacitor, aluminum electrolytic capacitor, or the like).

As having been described above, the interposer 210 of this embodiment includes the capacitor portion 211 in which the multilayered ceramic capacitor 212 having the ceramic layers 214 made of barium titanate and each interposed between the inner layer electrodes 213 is disposed and the surrounding portion 220 made of a material of a thermal expansion coefficient (about 8 ppm/° C.) lower than that of barium titanate (12 to 13 ppm/° C.) and surrounding the side of the capacitor portion 211. Thus, in case the temperature at a portion around the capacitor portion 211 has risen due to a high speed operation of the IC chip 230 to cause a certain thermal expansion of the ceramic layers 214, the thermal expansion of the ceramic layers 214 is suppressed since the surrounding portion 220 has a lower thermal expansion coefficient and a thermal expansion thereof has not yet been caused. Accordingly, the case where stress is applied to the connecting portions connected to the IC chip 230 and the package 250 due to the thermal expansion of the ceramic layers 214 occurs at a lower frequency, thus making it possible to make higher the reliability in the connection between the via electrodes 215 and the pads 232 by way of the bumps 216 and in the connection between the via electrodes 215 and the first terminals 257 by way of the bumps 232.

Further, the surrounding portion 220 has a relatively high Young's modulus of 300 GPa or more. Accordingly, deformation of the surrounding portion 220 when the surrounding portion 220 receives a high thermal stress from the package 250 is small, thus making it possible to suppress the thermal expansion of the dielectric.

Further, since the interposer 210 is structured so that the surrounding portion 220 surrounds all the outer peripheral side of the capacitor portion 211, the thermal expansion of the ceramic layers 214 is suppressed sufficiently by the surrounding portion 220. Accordingly, the reliability in the connection of the interposer 210 with the IC chip 230 and the package 250 can be made further higher.

Further, in the interposer 210 of this embodiment, the columnar electrodes 222 penetrating the surrounding portion 220 are provided as a wiring connecting between the IC chip 230 and the package 250, in addition to the via electrodes 215 penetrating the multilayered ceramic capacitor 212. Accordingly, the surface area of the interposer 210 for connection with the IC chip 230 and the package 250 is increased up to the surrounding portion 220, thus making it possible for the interposer 210 to be connected with an IC chip and a package that are larger in size. Further, the surrounding portion 220 provided with the columnar electrodes 222 is made of a material (alumina) having a specific inductive capacity lower than that of the ceramic layers 214 serving as a dielectric. Accordingly, it becomes possible to prevent capacity-connection between the columnar electrodes 222 thereby preventing transmission of an erroneous signal between the IC chip 230 and the package 250 through the columnar electrodes 222.

In case the interposer 210 is produced by the production process "A" (FIG. 18), the multilayered ceramic capacitor 212 is formed integral with the surrounding portion 220 thereby forming the surrounding portion 220 around the capacitor portion 211. Thus, it becomes possible to produce the interposer 210 in which the outer peripheral surface of the multilayered ceramic capacitor 212 and the surrounding portion 220 are fittingly engaged with each other at a high degree.

Further, in case the interposer 210 is produced by the production process "B" (FIG. 20), the multilayered ceramic capacitor 212 that is prepared separately is fitted in the space PF of the surrounding portion 220 thereby forming the surrounding portion 220 around the capacitor portion 211. By this, it becomes possible to produce the surrounding portion 220 serving as a substrate main body and the capacitor 212 separately. Accordingly, the surrounding portions having the spaces of various shapes can be freely combined with the various capacitors of different shapes and characteristics to obtain various interposers.

The following modifications of the fourth embodiment are possible.

[Modification 4-1]

For example, in the production process "B", the capacitor 212 may be formed so as to have a little smaller sectional area with respect a horizontal sectional plane than the space PF of the surrounding portion 220 such that when the capacitor 212 is fitted in the space PF a filler is interposed between the surrounding portion 220 and the capacitor 212 by an additional step. An interposer 310 produced by such an additional step is shown in FIGS. 22A and 22B.

Figure 22A:
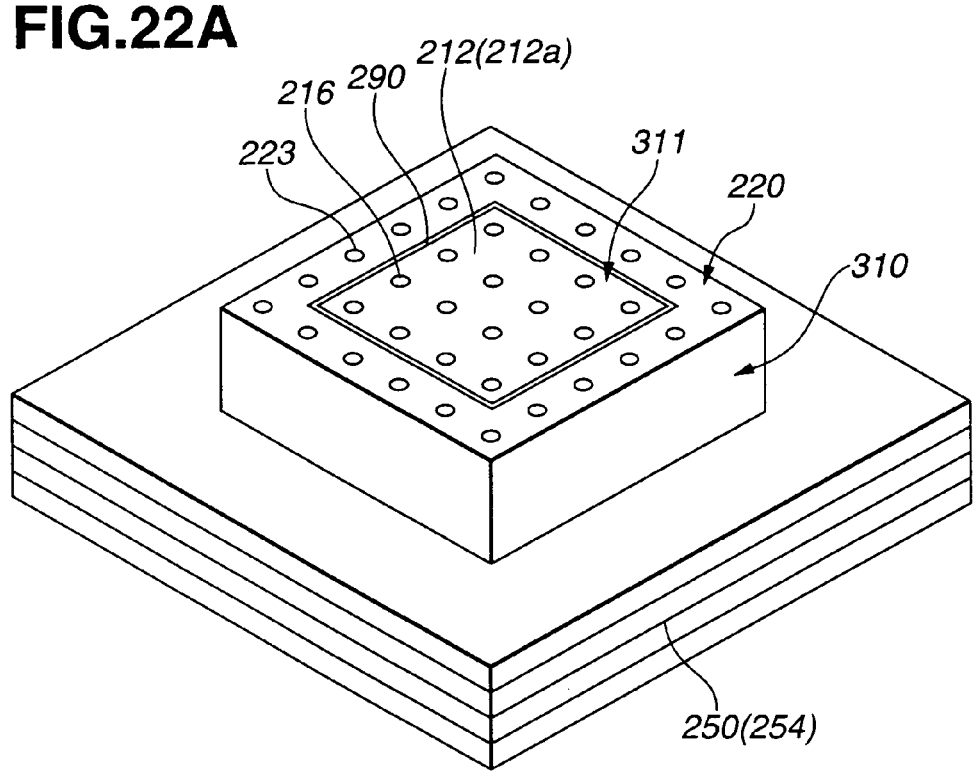
FIGS. 22A and 22B are schematic perspective views of a modification of the fourth embodiment.
Figure 22B:
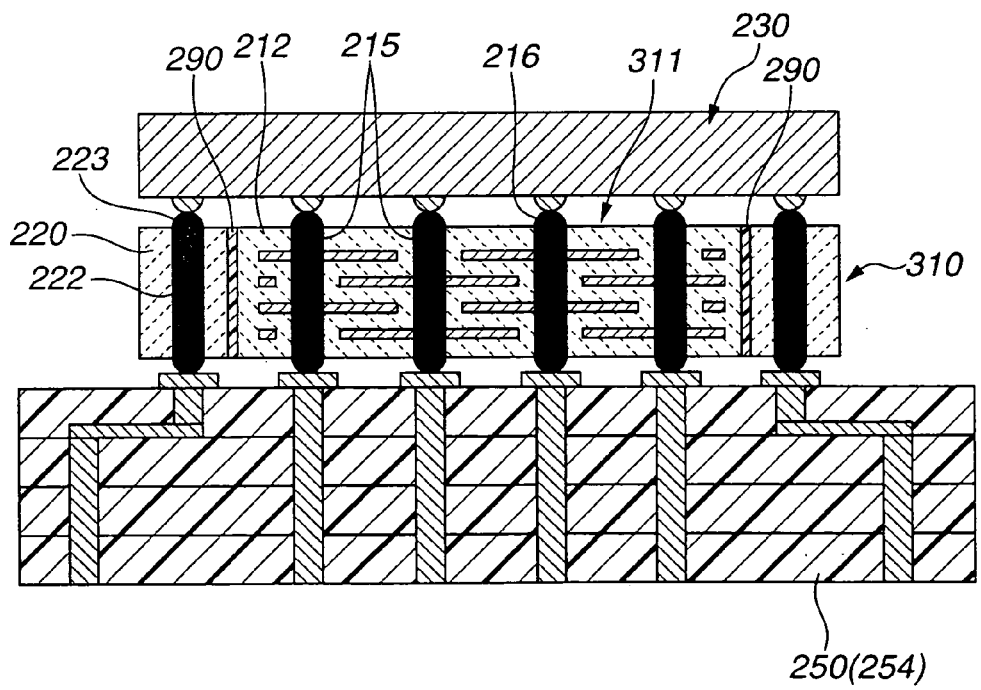

As shown in FIGS. 22A and 22B, in the gap between the surrounding portion 220 and the multilayered capacitor 212 is inserted a filler 290. The filler 290 is formed by filling resin paste into the above-described gap and cured. By the curing of the filler 290, the surrounding portion 220 and the multilayered ceramic capacitor 212 are joined to constitute an integral unit. By this production process, fine adjustment of the position at which the capacitor 212 is fitted in the space PF (capacitor portion 311) of the surrounding portion 220 can be made. Accordingly, it becomes easy to keep constant the positional relation between the via electrodes (power wires and ground wires) 215 provided to the capacitor portion 311 and the columnar electrodes (signal wires) 222 provided to the surrounding portion 220, thus making it possible to make higher the reliability in the connection of the interposer 310 with the IC chip 230 and the package 250. Further, since the filler 290 made of resin is interposed between the capacitor portion 311 made of barium titanate and the surrounding portion 220 made of alumina, the mechanical strength of the interposer 310 can be made higher by the effect of the resilience possessed by the filler 290.

[Modification 4-2]

Figure 23:
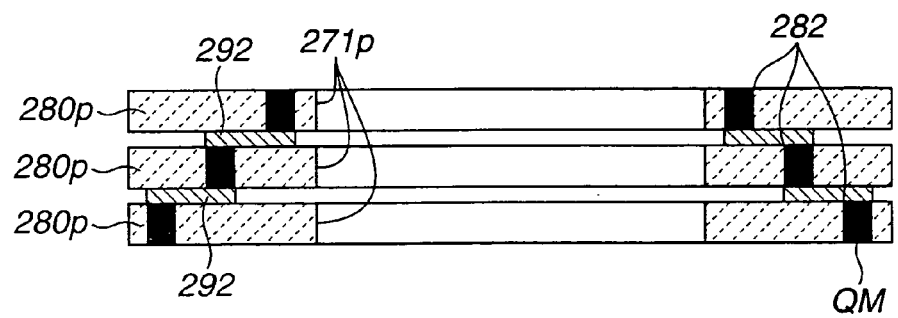
FIG. 23 is a schematic sectional view of another modification of the fourth embodiment.

While in the interposer 210 of the fourth embodiment the columnar electrodes 222 are extended straightly so as to penetrate the surrounding portion 220 between the upper surface 220a and the lower surface 220b, the columnar electrodes 222 may be formed into another shape. For example, the distance at which the columnar electrode 222 is apart from the capacitor portion 211 can be varied depending upon a variation in the axial or longitudinal position of the columnar electrode 222. With reference to FIG. 23, a production process of an interposer having such columnar electrodes 222 will be described as a modification of the production process "B". In this modification, in the step S220 of FIG. 20, the sheets 280p are formed with the through holes 282 so as to be different in the distance between the through hole 271P and the through hole 282. After wiring layers 292 for connection between the through holes 282 are printed, the electrically conductive material QM is filled in the through holes 282 and the sheets 280p are stacked. Each wiring layer 292 is formed in the region extending from the through hole 282 of the sheet 280 on which the wiring layer 292 is printed to the through hole 282 of the sheet 280p to be overlaid. By this, the through holes 282 of the upper and lower sheets 280 are electrically connected by way of the wiring layer 292. By the interposer produced by this method, even when the pads connected to the signal wires of the IC chip (corresponding to the pads 232 in the fourth embodiment) are different in position from the first terminals connected to the signal wires of the package (corresponding to the first terminals 257 in the fourth embodiment), connection between the IC chip and the package can be realized.

[Modification 4-3]

Figure 24:
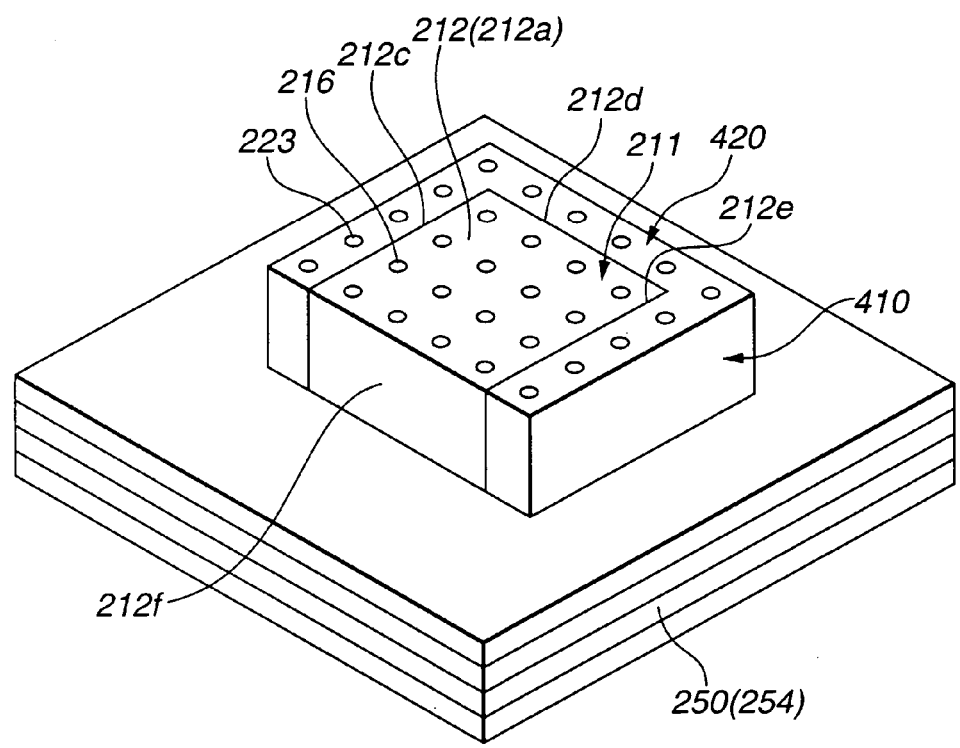
FIG. 24 is a schematic perspective view of a further modification of the fourth embodiment.

While in the interposer 210 of the fourth embodiment the surrounding portion 220 is formed so as to surround all of the lateral periphery of the capacitor portion 211, it can be formed so as to surround part of the lateral periphery of the capacitor portion 211. Such a modification is shown in FIG. 24. As shown in FIG. 24, an interposer 410 according to a third modification has a surrounding portion 420 surrounding three side surfaces 212c to 212e of a multilayered ceramic capacitor 212. By this, when a thermal expansion of the ceramic layers 214 is caused due to a rise of the temperature around the capacitor portion 211, a thermal expansion in the direction of the three side surfaces 212c to 212e is restricted or suppressed by the surrounding portion 420. Accordingly, the reliability in the connection of the interposer 410 with an IC chip and a package can be made higher as compared with the conventional structure.

Further, while in the fourth embodiment and its modifications, the ceramic layers 214 are formed of barium titanate, it can be formed of a material other than barium titanate and having a high specific inductive capacity such as strontium titanate (SrTiO3), lead titanate (PbTiO3) and titan oxide (TiO2). Further, while in the fourth embodiment, the surrounding portion 220 is formed of alumina, it will suffice to form the surrounding portion 220 of a material lower in the thermal expansion coefficient than the material forming the ceramic layers 214. For example, in case the material forming the ceramic layers 214 is barium titanate, it will suffice to form the surrounding portion 220 of a composite material consisting of alumina and glass (glass ceramic). In case the material forming the surrounding portion 220 is glass ceramic, it becomes possible to reduce the occurrence rate of breaking of wire or the like even when the columnar electrodes 222 are made of copper since glass ceramic is sintered at lower temperature than alumina.

In the meantime, in the fourth embodiment and its modifications, it is preferable that the thermal expansion coefficient of the material forming the surrounding portion 220 or 420 is 10 ppm/° C. or smaller. By this, a thermal expansion of the surrounding portion 220 or 420 is hard to be caused by a rise of the temperature around the capacitor portion 211, thus making it possible to expand the temperature range in which the thermal expansion of the ceramic layers 214 can be restricted or suppressed. Further, it is preferable that the specific inductive capacity of the material forming the ceramic layers 214 is larger than 15 and the specific inductive capacity of the material forming the surrounding portion 220 or 420 is 15 or smaller. In addition, the Young's modulus of the surrounding portion 220 is preferably 200 GPa or more and more preferably 300 GPa or more.

Further, in the fourth embodiment and its modifications, the interposer may be equipped with an IC chip and/or a package so as to constitute an integral unit or assembly. Examples of such an assembly are an IC chip equipped interposer assembly in which an IC chip is connected to the via electrodes and the columnar electrodes of the interposer, an interposer equipped package assembly in which a package is connected to the via electrodes and the columnar electrodes of the interposer, and an assembly in which the IC chip and the package are connected by interposing therebetween the interposer.

The technical ideas obtained by the embodiments described above will be enumerated.

(1) A capacitor characterized by including a capacitor main body approximately plate-shaped and having a thermal expansion coefficient smaller than 5.0 ppm/° C., the capacitor main body having a first surface on which a semiconductor device of a thermal expansion coefficient of 2.0 ppm/° C. or more and less than 5.0 ppm/° C. and having surface-connecting terminals are to be mounted and a second surface, and a plurality of electrically conductive vias extending through the first and second surfaces to be electrically connected to the surface-connecting terminals.

(2) The capacitor according to the technical idea (1), characterized in that the capacitor main body is made of an insulating material.

(3) The capacitor according to the technical idea (1), characterized in that the capacitor main body is made of a material having a thermal expansion coefficient smaller than that of the semiconductor device.

(4) The capacitor according to the technical idea (1), characterized in that the capacitor main body is made of a material having a rigidity higher than at least silicon.

(5) The capacitor according to the technical idea (1), characterized in that the capacitor main body is made of a material having a low thermal expansion coefficient and a high rigidity.

(6) The capacitor according to the technical idea (1), characterized in that the capacitor main body is made of a material having a Young's modulus of 200 GPa or more.

(7) The capacitor according the technical idea (1), characterized in that the capacitor main body is made of an insulating ceramic material having a Young's modulus of 200 GPa or more.

(8) The capacitor according to the technical idea (1), characterized in that the capacitor main body is made of engineering ceramic of nitride system.

(9) The capacitor according to the technical idea (1), characterized in that the capacitor body is made of aluminum nitride, silicon nitride or a mixed ceramic material of aluminum nitride and silicon nitride.

(10) The capacitor according to the technical idea (1), characterized in that the semiconductor device is sized so as to be 10 mm or larger at one side.

(11) An interposer characterized by comprising an interposer main body approximately plate-shaped and having a thermal expansion coefficient smaller than 5.0 ppm/° C., the interposer main body having a first surface on which a semiconductor device of a thermal expansion coefficient of 2.0 ppm/° C. or more and less than 5.0 ppm/° C. and having surface-connecting terminals are to be mounted, the interposer main body further having a second surface formed with a recess, a plurality of interposer main body side electrically conductive vias penetrating the interposer main body between the first and a bottom surface of the recess and adapted to be electrically connected to the surface-connecting terminals, and a capacitor disposed within the recess, the capacitor having a front surface and a rear surface and a plurality of capacitor side electrically conductive vias passing through the front and rear surfaces and adapted to be electrically connected to the interposer side electrically conductive vias.

(12) The interposer according the technical idea (11), characterized in that the interposer main body is made of an insulating material.

(13) The interposer according to the technical idea (11), characterized in that the interposer main body is made of a material having a thermal expansion coefficient lower than that of the semiconductor device.

(14) The interposer according to the technical idea (11), characterized in that the interposer main body is made of a material having a rigidity higher than at least silicon.

(15) The interposer according to the technical idea (11), characterized in that the interposer main body is made of a material having a low thermal expansion coefficient and a high rigidity.

(16) The interposer according to the technical idea (11), characterized in that the interposer main body is made of a material having a Young's modulus of 200 GPa or more.

(17) The interposer according the technical idea (11), characterized in that the interposer main body is made of an insulating ceramic material having a Young's modulus of 200 GPa or more.

(18) The interposer according to the technical idea (11), characterized in that the interposer main body is made of engineering ceramic of nitride system.

(19) The interposer according to the technical idea (11), characterized in that the interposer main body is made of aluminum nitride, silicon nitride or a mixed ceramic material of aluminum nitride and silicon nitride.

(20) The interposer according to the technical idea (11), characterized in that the semiconductor device is sized so as to be 10 mm or larger at one side.

(21) The interposer according to the technical idea (11), characterized in that the interposer main body and the capacitor are structured so as to be integral with each other, the interposer main body side electrically conductive vias and the capacitor side electrically conductive vias are directed connected to each other without interposing protruded electrodes therebetween.

(22) A fabrication method of an interposer including a capacitor main body nearly plate-shaped and having a thermal expansion coefficient smaller than 5.0 ppm/° C., the capacitor main body having a first surface on which a semiconductor device of a thermal expansion coefficient of 2.0 ppm/° C. or more and less than 5.0 ppm/° C. and having surface-connecting terminals are to be mounted, the capacitor main body further having a second surface formed with a recess, a plurality of interposer main body side electrically conductive vias penetrating the interposer main body between the first and a bottom surface of the recess and adapted to be electrically connected to the surface-connecting terminals, and a capacitor disposed within the recess, the capacitor having a front surface and a rear surface and a plurality of capacitor side electrically conductive vias passing through the front and rear surfaces and adapted to be electrically connected to the interposer side electrically conductive vias, the method being characterized by comprising a step of forming an unsintered ceramic body having the recess and first electrically conductive via forming holes, a step of filling a electrically conductive material in the first electrically conductive via forming holes and thereby forming unsintered interposer side electrically conductive vias, a step of filling a ceramic material in the recess of the unsintered ceramic body and thereby forming unsintered ceramic dielectric layers that are later formed into the interposer main body, a step of forming second electrically conductive via forming holes in the unsintered ceramic dielectric layers and filling a electrically conductive material in the second electrically conductive via forming holes thereby forming unsintered capacitor side electrically conductive vias, and a step of firing the unsintered ceramic body, the unsintered ceramic dielectric layers, the unsintered interposer side electrically conductive vias and the unsintered capacitor side electrically conductive vias all together thereby sintering the same.

The entire contents of Japanese Patent Applications P2003-076536 (filed Mar. 19, 2003), P2003-199234 (filed Jul. 18, 2003) and P2003-432369 (filed Dec. 26, 2003) are incorporated herein by reference.

Figure 14:
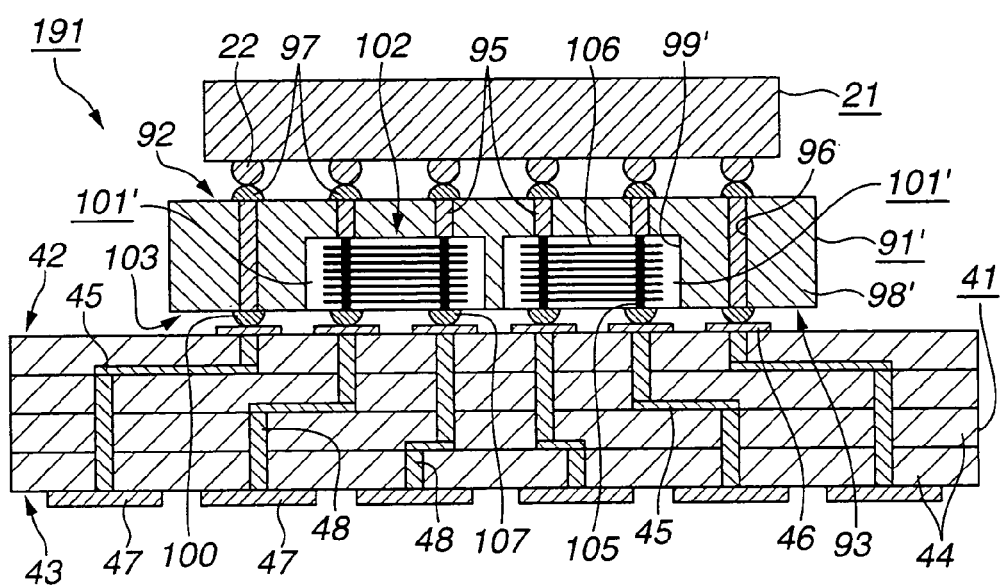
FIG. 14 is a schematic sectional view of a semiconductor package (assembly) consisting of an IC chip (semiconductor device), an interposer with a built-in capacitor and a circuit substrate (substrate) according to a third embodiment of the present invention.

Although the invention has been described above by reference to a certain embodiment of the invention, the invention is not limited to the embodiment described above. Modifications and variations of the embodiment described above will occur to those skilled in the art, in light of the above teachings. For example, while in the second embodiment the recess 99 is formed so as to be positioned at one central place of the interposer main body 98, it is not necessarily positioned at the central place. Further, as shown in FIG. 14, an interposer main body 98' of an interposer 91' of a modified semiconductor package 191 may be formed with a plurality of recesses 99' within which are disposed the respective capacitors 101'. Further, though not shown, a plurality of capacitors 101 may be disposed within one recess 99. When this is the case, the capacitors 101 may be stacked in the thickness direction of the interposer 91 or may be arranged in the surface direction of the interposer 91. The scope of the invention is defined with reference to the following claims.

What is claimed is:

1. A capacitor equipped substrate assembly comprising:
a substrate having surface-connecting pads; and
a capacitor having an approximately plate-shaped capacitor main body having a first surface and a second surface at which the capacitor is mounted on the substrate and a plurality of electrically conductive vias penetrating the capacitor main body between the first and second surfaces and connected to the surface-connecting pads,
wherein the thermal expansion coefficient of the capacitor main body is smaller than that of the substrate.

2. An assembly comprising:
a semiconductor device having surface-connecting terminals;
a substrate having surface-connecting pads; and
a capacitor having an approximately plate-shaped capacitor main body having a first surface on which the semiconductor device is mounted and a second surface at which the capacitor main body is mounted on the substrate and a plurality of electrically conductive vias penetrating the capacitor main body between the first and second surfaces and connected to the surface-connecting terminals and the surface-connecting pads, wherein the thermal expansion coefficient of the capacitor main body is smaller than that of the substrate.

3. An interposer comprising:

an interposer main body having a first surface on which a semiconductor device having surface-connecting terminals is mounted and a second surface formed with a recess;

a plurality of interposer main body side electrically conductive vias penetrating the interposer main body between the first surface and a bottom surface of the recess and connected to the surface-connecting terminals; and a capacitor disposed in the recess and having front and rear surfaces and a plurality of capacitor side electrically conductive vias passing through the front and rear surfaces and connected to the interposer main body side electrically conductive vias.

4. An interposer according to claim 3, further comprising, within the interposer main body, a plurality of short electrically conductive ground vias passing through the first surface and an electrically conductive via pitch changing layer, at least a part of the short electrically conductive ground vias being electrically connected to ground vias of the capacitor side electrically conductive vias by way of the electrically conductive via pitch-changing layer.

5. An interposer according to claim 3, further comprising, within the interposer main body, a plurality of short electrically conductive power vias passing through the first surface and an electrically conductive via pitch-changing layer, at least a part of the short electrically conductive power vias being electrically connected to power vias of the capacitor side electrically conductive vias by way of the electrically conductive via pitch-changing layer.

6. A semiconductor device equipped interposer assembly comprising:

a semiconductor device having surface-connecting terminals; and an interposer having an approximately plate-shaped interposer main body having a first surface on which the semiconductor device having surface-connecting terminals is mounted and a second surface formed with a recess, a plurality of interposer main body side electrically conductive vias penetrating the interposer main body between the first surface and a bottom surface of the recess and connected to the surface-connecting terminals, and a capacitor disposed in the recess and having front and rear surfaces and a plurality of capacitor side electrically conductive vias extending through the front and rear surfaces and connected to the interposer main body side electrically conductive vias.

7. An interposer equipped substrate assembly comprising:

a substrate having surface-connecting terminals; and an interposer having an approximately plate-shaped interposer main body having a first surface and a second surface formed with a recess, the interposer main body being mounted at the second surface on the substrate, the interposer further having a plurality of interposer main body side electrically conductive vias penetrating the interposer main body between the first and second surfaces and connected to the surface-connecting terminals and a capacitor disposed in the recess and having front and rear surfaces and a plurality of capacitor side electrically conductive vias passing through the front and rear surfaces and connected to the interposer main body side electrically conductive vias.

8. An assembly comprising:

a semiconductor device having surface-connecting terminals;

a substrate having surface-connecting pads; and an interposer having an approximately plate-shaped interposer main body having a first surface on which the semiconductor device is mounted and a second surface formed with a recess, the interposer main body being mounted at the second surface on the substrate, the interposer further having a plurality of interposer main body side electrically conductive vias penetrating the interposer main body between the first surface and a bottom surface of the recess and connected to the surface-connecting terminals and a capacitor disposed in the recess and having front and rear surfaces and a plurality of capacitor side electrically conductive vias passing through the front and rear surfaces and connected to the interposer main body side electrically conductive vias and the surface connecting pads.

* * * * *